United States Patent [19]

Bacou et al.

[11] Patent Number: 4,811,361

[45] Date of Patent: Mar. 7, 1989

[54] METHOD AND APPARATUS FOR TRANSMISSION OF DIGITAL DATA

[75] Inventors: Claude Bacou, Neauphle le Chateau; Christian Cabrol, Plaisir; Rene Baptiste, Flancourt Maurepas; Andre Oisel, Elancourt, all of France

[73] Assignee: Bull, S.A., Paris, France

[21] Appl. No.: 114,202

[22] Filed: Oct. 29, 1987

[30] Foreign Application Priority Data

Oct. 30, 1986 [FR] France ................. 86 15134

[51] Int. Cl.[4] .................... H04J 3/16; H04L 1/00
[52] U.S. Cl. ........................ 375/25; 370/89; 371/37; 371/55; 375/34
[58] Field of Search ........... 375/25, 34, 37, 38, 375/58; 371/37, 55; 380/42, 49; 360/40; 370/86, 92, 94, 89

[56] References Cited

U.S. PATENT DOCUMENTS

| | | | |
|---|---|---|---|
| 3,631,471 | 12/1971 | Griffiths | 371/55 |
| 4,346,472 | 8/1982 | Ohkoshi et al. | 371/37 |
| 4,433,416 | 2/1984 | Kojima | 371/37 |
| 4,486,739 | 12/1984 | Franaszek et al. | 340/347 |
| 4,569,050 | 2/1986 | Ohme | 371/37 |
| 4,669,000 | 5/1987 | Odaka et al. | 371/37 |

*Primary Examiner*—Benedict V. Safourek

[57] ABSTRACT

A method and apparatus for transmission of digital data in which data words having M parallel bits are encoded into code words having N parallel bits, the code words being serially transmitted and being accompanied by flags such as Start Delimiter, End Delimeter of the frame or token. The code words and the flags are selected so as to balance the DC component. The time interval between two successive transitions of the serially transmitted signals is limited to four times the period of the serial transmission clock. For detection of errors in transmission, the Hamming distance between a flag and any encoded sequence of the same length extracted from any message is at least equal to 2. The invention is useful with transmitters and receivers that exploit the properties of the transmission method, and is applicable to data networks.

20 Claims, 9 Drawing Sheets

| DATA WORD | AC | CODE WORD | DC |
|---|---|---|---|
| M0 | 0 | TZ0 | 0 |
| M1 | 0 | TZ1 | 0 |
| M2 | 0 | TZ2 | 0 |
| = | = | = | = |
| M151 | 0 | TZ151 | 0 |
| M152 | 0 | TP0 | 1 |
| M153 | 0 | TP1 | 1 |
| = | = | = | = |
| M255 | 0 | TP103 | 1 |
| M0 | 1 | TZ0 | 0 |
| M1 | 1 | TZ1 | 0 |
| M2 | 1 | TZ2 | 0 |
| = | = | = | = |
| M151 | 1 | TZ151 | 0 |
| M152 | 1 | TM0 | 1 |
| M153 | 1 | TM1 | 1 |
| = | = | = | = |
| M255 | 1 | TM103 | 1 |

| ADDRESS | DATA | E |
|---|---|---|
| C0 | D0 | 0 |
| C1 | D1 | 0 |
| C2 | D2 | 0 |
| — | — | — |
| — | — | — |
| × | — | 1 |
| — | — | |
| C1023 | D1023 | 1023 |

METHOD AND APPARATUS FOR TRANSMISSION OF DIGITAL DATA

FIELD OF THE INVENTION

The present invention relates generally to the field of digital data transmission and more specifically to techniques for encoding signals prior to transmission and decoding them after reception, the signals being serially transmitted via a transmission line and being self-clocked.

The invention is also applicable to the recording field.

More particularly, the invention relates to methods and apparatus for digital data transmission of encoded signals, which further enables a high data rate transmission over a long distance, while providing exceptional security in the exchange of information.

The invention may for example be used in distributed data processing systems, local area networks, or CAD (computer aided design) networks.

BACKGROUND OF THE INVENTION

It is known that a transmission system of the type to which the invention relates comprises a plurality of transmitters and receivers connected with one another by a physical channel. In such systems, if the data rate of exchanged information is to be increased, there are essentially two types of limitations: first, the transmission capacity of the physical channel, and second, the processing speed of the interface circuits of the transmitters and receivers.

The usual transmission channels use twisted pairs, coaxial cables, or fiber optic connections. The highest transmission capacity is obtained at present by using fiber optics, which permit data rates on the order of one gigabit per second. These performances surpass those of present interface circuits, and it is particularly in the field of these circuits that progress is sought.

The speed of interface circuits depends first of all on the maximum operating frequency, allowed by the technology used. It is known that circuits using CMOS technology can operate at a frequency on the order of 20 MHz, circuits using ECL technology at a frequency on the order of 200 MHz, and circuits using current gallium arsenide technology at a frequency on the order of 700 MHz. These operating frequencies thus impose a primary limitation on conceivable data rates.

The data rate performance of a transmission system, however, does not depend only on the operating frequency of the circuits. The rate of useful information, and the maximum transmission range, increase when the signal transmitted is "self-clocking" (that is, if a clock signal can be extracted from it that has a predetermined phase relationship with the signal received). This property makes it unnecessary to transmit the information and the clock signal in two separate channels, with the associated limitations in terms of the difficulty of controlling the phase shift between the two channels. To make it possible to extract the clock signal, the useful data are encoded prior to being transmitted, such that the frequency of the transitions in the encoded signal remains above the operating limit of the clock recovery circuit (which may be a filter or a phase locked loop). The code used, known as a modulation code, introduces redundancy, so that the rate of encoded data is greater than the rate of useful data, the difference depending on the coding rate. Thus for a given technology, the maximum rate of useful data will depend on the modulation code used. Redundancy, the necessity of which is apparent here, also enables taking into account other constraints which are imposed on the code in order to facilitate its use and will be described in due course.

Finally, if the transcoding circuits operate in parallel on words of M bits, rather than serially on the bits, the same technology makes it possible to attain a data rate that is M times higher for this function. The modulation code is then known as a group code. Since data processing systems typically process data comprising a number of bits that is a power of 2, the group codes are designed for values of M powers of 2. The Manchester and Miller codes are classic examples of serial codes, the coding rate of which is 0.5 (2 code bits for 1 data bit). The associated transcoding circuits operate at a clock frequency of twice the rate of useful binary data. On the other hand, for the coding process known as 8B/10B, which encodes useful data words of 8 parallel bits into code words of 10 parallel bits transmitted serially, parallel transcoding circuits operate at a clock frequency equal to one-eighth of the useful data rate. The only circuits that perform parallel-to-serial and serial-to-parallel conversions use a clock frequency equal to 1.25 times the useful data rate, since the coding rate is 0.8.

Another important parameter affecting serial transmission performance is the range of variation of the time intervals separating two successive transitions of the signal transmitted. The maximum value of this time interval must in fact be limited to allow the extraction of the clock signal based on the only transitions of the signal received. Moreover, the range of variation, which is defined relative to the clock period T of the transmitter terminal circuit, determines the frequency spectrum of the signals transmitted. Consequently this parameter dictates the performance of the terminal circuits of the receivers, such as optoelectronic transducer, amplifier, and clock recovery circuits. For example, in the case where the coding is of the parallel type, the bits of one code word are generally transmitted serially with a modulation of the NRZ (non-return-to-zero) type. Thus the variations in the time interval between two successive transitions are directly a function of the code words used, that is, of the successions of logical zeroes or logical ones that appear in a code word. The code words must accordingly be selected taking into account the time intervals between two transitions that they generate.

Supplementary to the frequency band width constraints mentioned above, the following considerations must also be taken into account. In a baseband transmission channel where the processing of the signal consists in its comparison to a level threshold, as is generally the case, the information transmitted comprises the number and position of transitions of the coded signal relative to the clock signal with which it is associated. Phase distortions, which affect this relative position, can accordingly be sources of error.

The signal transmitted undergoes both a distortion that is random in character, due to noise, and a systematic distortion associated with the bandwidth of the channel. At the very high data rates of interest here, the bandwidth of the channel must be very greatly extended towards high frequencies. The low-frequency end is limited, so as to reduce noise and to facilitate realizing the transducers. It is accordingly important that the encoded signal does not suffer from this limitation. For this purpose, very low-frequency components must be removed from its spectrum, and the encoded signal must in particular have a constant mean value. When an optical channel using a laser diode emitter and/or a receiver including an automatic gain control is involved, the optical power emitted and the level of the signal received are often controlled by automatic control devices which measure the mean value of the encoded signal and keep it constant. These devices do not function correctly unless the modulation method used delivers an encoded signal having a mean value that does not depend on the data to be encoded. Codes having this property are known as DC balanced codes.

More precisely, for a modulation code to be DC balanced, the integral over time of a transmitted signal must be limited, no matter what kind of message is transmitted or how long it is. To measure this property of the code, the "charge" of one word or one message must be defined. In the case of an NRZ modulation, the charge is defined in the following manner: The coefficients $+1$ and $-1$, respectively, are assigned to the binary elements 1 and 0. The charge is then defined as the algebraic sum of these coefficients for all the bits of the word or message, or as the difference between the number of ones and the number of zeroes comprising the word or message. The charge must remain between two finite limits.

The useful data are transmitted in the form of code words that are concatenated and embodied as frames. The network protocol generally adds supplementary code words to the end of the frame, comprising a "key". This key makes it possible to detect the most frequent transmission errors when the frame does not exceed a certain length. Decoding, error detection and frame utilization require that the receiver correctly locate the boundaries of the words and of the frames. To do this, the transmitter must mark the stream of useful data with indicators, also known as flags, which are required for synchronization of the receiver. Examples of these flags are the token that grants the station the right of access to the channel, and frame delimiters; the flag at the beginning of the frame synchronizes the word clock of the receiver. In all the phase situations of its own word clock relative to the signal received, the receiver must therefore distinguish the data from the flags, and it must also distinguish among the flags. Very generally, error detection applies to the data transmitted, not to the flags; since the flags are managed locally by the channel, the network monitoring perceives only indirectly those anomalies that affect them: at the end of a delay (disappearance of the token) or of a complex logic operation (loft of a frame, duplication of the token). This delay in detection is deleterious to the quality of service, especially if the network is used for real-time applications. In the ring type of networks, where the information is transmitted through a succession of point-to-point links, each station must regenerate the signal received and then transmit it to the next station. Each frame travels through the entire loop and returns to its origin for verification; the probability of error relating to one frame increases with the number of stations in the loop. In this kind of arrangement, it is therefore desirable for the most frequent faults (simple errors, inversion of one bit) to be detected immediately and indicated by the receiver, even when they affect a flag.

Some of the problems addressed above are also addressed in U.S. Pat. No. 4,486,739 of Peter A. Franaszek and Albert X. Widmer, issued Dec. 4, 1984, and in an article entitled "A DC balanced, partitioned-block, 8B/10B transmission code", published in the IBM Journal of Research and Development, Vol. 27, No. 5, September 1983, pages 440–451. However, the codes described in this article do not offer the necessary guarantees for detecting the flags, especially when the word clock of the receiver is no longer, or not yet, synchronized with the signal received. A single flag is defined as having a Hamming distance of at least 2 with respect to every code word. It has a distance of less than 2 with respect to the encoded sequences connecting the segments of the concatenated words. Knowing that the flag is used to synchronize the word clock of the receiver, the inadequacy of this feature will be appreciated: A simple error is enough to change data to a flag, or a flag to a data, without the decoder being able to detect the error.

OBJECT AND SUMMARY OF THE INVENTION

It is the object of the present invention to overcome these disadvantages, by providing an encoding method with which better security is attainable and which best addresses all the aforementioned constraints. The method according to the invention is also such that its execution is facilitated. Thus the invention also relates to transmission and reception equipment adapted to performing the method.

More precisely, the subject of the invention is a method of transmission of digital data in which each data word including a number M of bits is encoded by an associated code word including N bits, N being greater than M, each code word being intended to be transmitted serially, a succession of code words forming a frame, said frame being accompanied by at least one flag transmitted serially, characterized in that each of said code words has the following properties:

it contains no more than four consecutive logical ones or four consecutive logical zeroes (RLL or run length limitation constraint)

it neither begins nor ends with more than two consecutive logical ones or two consecutive logical zeroes;

its "charge", that is, the algebraic difference between the number of logical ones and the number of logical zeroes comprising it, equals no more than 2 as an absolute value.

This transmission method is also characterized in that each flag includes a number of bits equal to N or a multiple of N and has the following properties:

it contains no more than four consecutive logical ones or four consecutive logical zeroes (RLL constraint).

it neither begins nor ends with more than two consecutive logical ones or two consecutive logical zeroes; and the Hamming distance between a flag and any encoded sequence of the same length extracted from a frame of any kind is at least equal to 2.

Another object of the present invention is to provide a transmission apparatus for a digital data transmission system, including an encoding device that receives data words including M bits in parallel and furnishes code words including N bits in parallel, N being greater than M, to a parallel/serial conversion device, a local clock connected to a control device that furnishes control and synchronization signals to the encoding and conversion devices, such as to serially transmit successions of flags and code words forming frames, said transmission apparatus being characterized in that the encoding device includes means for generating, as a function of each data word and of control signals, a code word or a flag having the following properties:

it contains no more than four consecutive logical ones or four consecutive logical zeros (RLL constraint);

it neither begins nor ends with more than two consecutive logical ones or two consecutive logical zeroes;

each code word having a charge at most equal to 1 as an absolute value, if N is odd, or 2 as an absolute value, if N is even, the Hamming distance between a flag and any sequence extracted from a frame of any kind comprising as many consecutive bits as the flag, being at least equal to 2, the encoding device being capable of furnishing either a flag or a fraction of a flag, depending on whether the flag includes N bits or a multiple of N bits.

The present invention also relates to a reception apparatus for a digital data transmission system including a clock recovery circuit for generating a clock signal F based on an input signal coming from a transmission line, a serial/parallel converter synchronized by this clock signal F and the input of which receives said input signal, a decoding device receiving words of N bits from said serial/parallel converter, a detection device for detecting the presence of flags in the signal received, identifying said flags, and furnishing service signals SD, ED, T as a function of the flags recognized, a control and sequencing device receiving the clock signal F and in response to said service signals furnishing control and sequencing signals to said decoding device, this reception apparatus being characterized in that the decoding device, as a function of each word of N bits present at its inputs, furnishes a data word of M bits, M being less than N, whenever the N bits comprise a code word, and furnishes an error signal E whenever the N bits do not comprise any code word.

Further characteristics and details of embodiment will become apparent from the ensuing description of preferred embodiments shown in the drawings.

DESCRIPTION OF THE PREFERRED EMBODIMENTS

Figure 1:
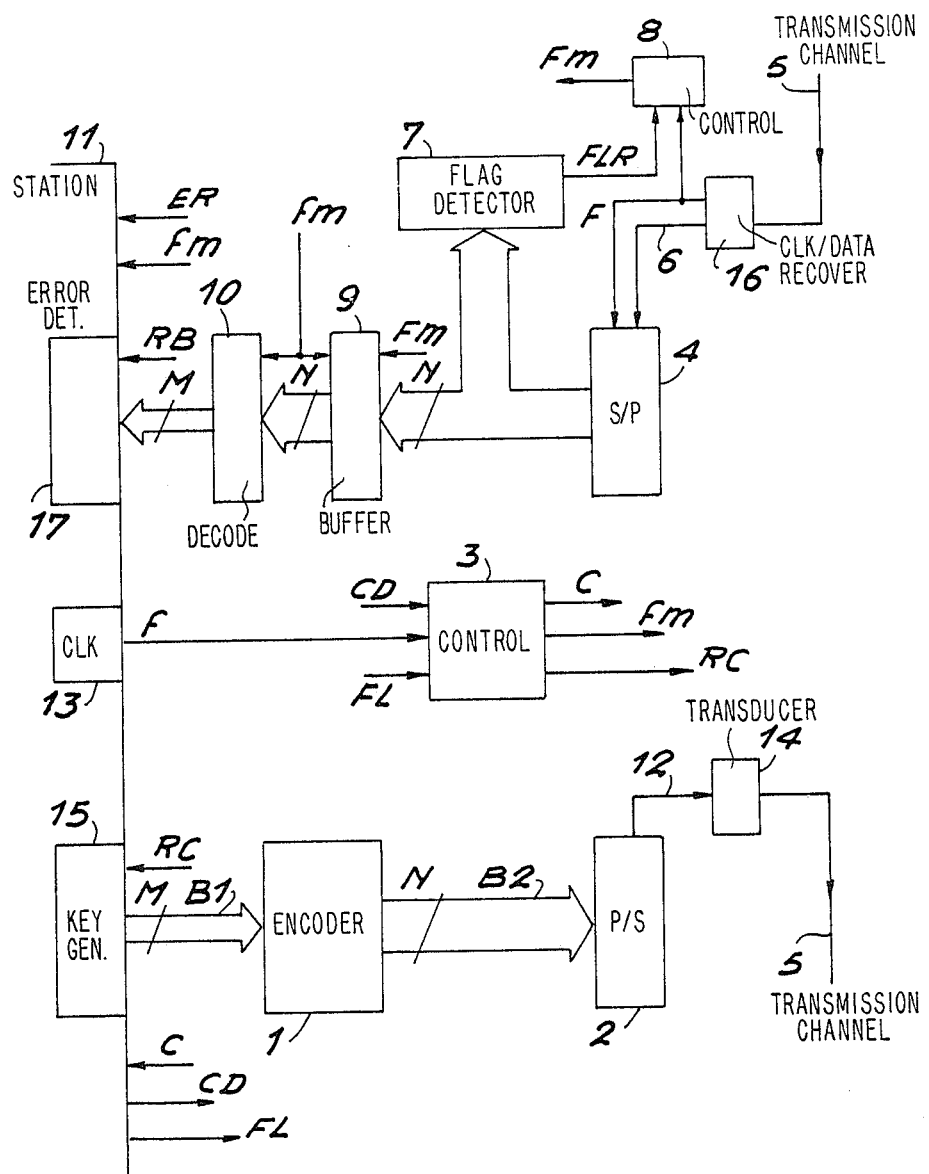
FIG. 1 schematically shows the transmission and reception apparatuses according to the invention.

In the usual fashion, à transmission method comprises a method of sending associated with a method of reception that is conditioned by the sending method.

A first important characteristic of a transmission method is the method of encoding data words that are to be transmitted. This encoding method must facilitate decoding upon reception. Another important characteristic is the method of generating flags associated with the transmission protocol. This method of generating flags must favor the detection of these flags upon reception. As the following discussion will show, the transmission method according to the invention relates in particular to such methods of encoding and flag generation, in particular the use of code words and flags having properties that are closely associated with performance constraints and with the reliability of transmission.

For a greater understanding of the advantages attained with the transmission method according to the present invention, it will be useful to provide some indication of how it can be put into practice. With this in mind, the reader's attention is invited to FIG. 1 which is a schematic representation of the essential elements comprising the encoding and decoding circuits used in a terminal of a network. The data to be encoded appear on the bus B1, which is connected to the encoding circuit 1. The bus B1 includes a number of lines M, and the encoding circuit furnishes N bits in parallel to its output. These bits are transmitted via a bus B2 to a circuit 2 for parallel/serial converstion. The output 12 of converter 2 is connected to a transmission channel 5 through a transducer 14. The circuit also includes a clock device (CLK) 13 and a control and sequencing device 3, which controls the parallel/serial converter 2 and the encoding circuit 1 synchronously. If the clock frequency at which the encoded data are serially transmitted through the transmission channel 5 is called f, then the parallel/serial converter must operate at this frequency f, while the encoding circuit 1 must operate at the frequency f/N.

The receiving portion includes a transducer/clock recovery device 16, which receives the encoded data serially from the channel 5 and furnishes two signals to the serial/parallel converter 4, the bit clock signal F, and, at its serial output 6, the encoded data synchronized with the clock F. The converter 4 is connected at its parallel output to two devices, namely a flag detector 7 add a buffer 9, to which it furnishes encoded words of N bits. A control and sequencing device 8 receives the bit clock signal F from the transducer 16 and the signal FLR, which indicates reception of a word synchronization flag, from the detector 7. At its output, the device 8 furnishes a "word received" clock signal Fm having a frequency F/N, which clocks the transfers between the converter 4 and the buffer 9. Only the reception components mentioned above depend for their synchronization on the "bit received" clock F and on the "word received" clock derived from it.

At its output, the buffer 9 furnishes encoded words of N bits in parallel to a decoding circuit 10. At its output, the decoding circuit 10 furnishes data words of M bits in parallel, which, in the code selected, are associated with words of N bits that have been received. The reception portion, when it detects a transmission error or malfunctioning of any kind, indicates this to the station 11 by setting the signal ER. The local word clock fm controls the exchanges between the output of the buffer 9, the decoder 10 and the station 11.

In the reception portion, the serial/parallel converter thus operates at the frequency F, while the buffer 9 and the decoding circuit 10 operate only at a frequency that is N times lower. Thus the most complex circuits (buffer, encoder, decoder) can be realized using technology that is not as fast as that reserved for the transducer, the serial/parallel converter and the flag detector.

The method for obtaining the code words and the flags used in the transmission method described above will now be described in detail.

Taking into account the constraints associated with the intended applications, the choice of M and N is not arbitrary. If the terminal operates with 16-bit words, M can be chosen to equal 16, or even a submultiple of 16. If M is made equal to 8, the data words of the terminal must be multiplexed in two groups of 8 bits prior to being encoded. This obviously has the disadvantage of slowing down the encoding processing. On the other hand, it simplifies the encoding circuit. Based on this example, it will now be understood that the choice of M will be a compromise between parallel encoding performance, on the one hand, and the complexity of its realization, on the other.

When M has been chosen, defining $2^M$ possible combinations of M bits, and hence $2^M$ data words to be encoded, it is suitable to determine N such that there will be at least $2^M$ code words of N bits, taking into account the technological constraints associated with the transmission channel.

The first constraint, already noted above, relates to the range of variation of the interval between successive transitions of the signals transmitted. The method according to the invention dictates that each interval between successive transitions will be included between 1 T and 4 T, T being the period of the serial transmission. It is thus necessary to exclude as code words any words that include more than four consecutive logical ones or four consecutive logical zeroes. On the other hand, a message of any kind must also verify this constraint. Accordingly, the concatenation of two code words of any kind can never cause more than four consecutive logical ones or zeroes to appear. To this end, it is enough to avoid the use of code words beginning or ending with more than two consecutive logical zeroes or ones. If this condition is not met, then it would be necessary to provide a logic element for word concatenation, which would clearly mean a complication at the control level and would favor the propagation of errors. Here, the independence of the concatenated code words means that if one of them is affected by a transmission error, this error will remain confined within a data word of M bits after decoding.

In addition to the above constraint, the selected code words must meet a second condition, associated with the charge. The general problem to be solved here will thus be to determine code words and word concatenations which limit the cumulated charge of a message of any kind.

A first step in solving this problem will be to give priority to selecting code words having a minimal charge.

In the case where N is an even number, code words exist that have a zero charge. These are all the code words having as many logical zeroes as logical ones. These code words with the zero charge are therefore the ones it is most important to keep for developing an encoding system. Nevertheless, depending on the value of N selected and in view of the constraints involved, it either will or will not be possible to find as many code words with a zero charge as there are data words to be encoded. Thus for the 8B/10B code, there are 256 different data words to be encoded. The code words should be chosen from among the 1024 possible combinations of 10 bits. However, if only those words that meet the RLL and end constraints are to be kept, then only 180 possible code words are found that have a zero charge, and this is not enough to encode the 256 data words. It will accordingly be necessary to accept code words that have a non-zero charge. These code words, having a charge that is not zero, but is of minimal value, are those that have four logical ones and six logical zeros, or four logical zeroes and six logical ones. Each of these words will have a charge equal to 2, as an absolute value. Taking into account the chosen constraints, there are 124 words having a charge of $+2$ and 124 complementary words having a charge of $-2$.

If the code words are used carelessly, it will be possible to produce a message comprising a succession of code words all having a positive charge. Thus the cumulated charge of the message can increase unlimitedly. Accordingly, a method must be provided for limiting the cumulated charge.

To do this, it should be noted that the set of all the possible data words is divided into two subsets. The first subset includes the data words that are biuniquely associated with a code word having a zero charge. The second subset comprises the remaining data words, which are associated with two code words of opposite, non-zero charges. To assure that a message of any kind will have a limited charge, it is suitable to provide a means of charge management. This management will comprise, first, memorizing the sign of the last charged code word transmitted; then, as soon as a data word that is to be encoded and that corresponds to a code word having a non-zero charge appears, the code word having a charge opposite the memorized sign will be selected. This kind of management is easy to realize, as will be seen hereinafter in the description of the preferred embodiment.

In the case of the 8B/10B code, there are accordingly 180 code words having a zero charge and also satisfying the RLL constraint. There are also 124 code words having a charge equal to $+2$, and 124 code words, complementary to them, having a charge equal to $-2$. A total of 304 different code words are now available for encoding the 256 possible data words, which is entirely sufficient. The two charged code words associated with the same data word may for example be complementary to one another.

An analogous method can be used in the case where N is odd, but in that case there will be no word with a zero charge.

To realize a transmission method, it is also necessary to choose indicators, or flags. As already mentioned in connection with FIG. 1, the encoding method requires the presence of a word clock. This word clock must be present both at the level of the encoding circuit and at the level of the decoding circuit. To facilitate synchronization, especially at the level of the decoding circuit, it is best to choose flags having a length that is a multiple of the length of the code words. On the other hand, the flags must also meet the two criteria discussed above.

Finally, it is important that the receivers be reliably able to detect these flags. To this end, an important characteristic of the invention is that an additional constraint is imposed on these flags. This constraint requires that each flag be spaced apart by a Hamming distance (or logical distance) equal to at least 2 from any sequence extracted from a message of any kind and comprising as many consecutive bits as the flag includes. Thus because of this additional condition, it is certain that an error of one bit can be detected by the decoder if it affects a flag; the error will not be able to transform one flag into another, or transform a data sequence into a flag or reversely.

The search for flags that satisfy all the aforementioned constraints does not inevitably result in a code of some kind. However, it is possible to find a solution, if the flags are given an adequate length. To illustrate this possiblity, a detailed discussion will now be provided of the results obtained in the case of the 8B/10B code. It will be appreciated, however, that the method of searching for flags to be discussed below can be applied generally to any code.

For the sake of simplicity, it is appropriate to search first for the existence of flags having the same length as a code word. As shown above, there are 304 possible code words, hereinafter known as "code word candidates". The flags must accordingly be sought from among them. The search can be done systematically, in the following manner. From the 304 code word candidates, one is selected, which is defined as a "flag candidate". Then the set of remaining code words is considered, and all the possible pairs of code words extracted from this set are formed, going by the rule of alternation of weights. Then, the words formed by concatenation of the two words of each of these pairs is considered, and the flag candidate is compared with each set of consecutive bits of the same length extracted from this pair. If this comparison reveals that the logical distance between the flag candidate and at least one sequence is equal to 0 or 1, the tested pair must never appear in a message. To assure this, it is necessary that at least one of the candidate code words comprising this pair not be part of the set of retained code words. When the same operation has been repeated for all the pairs of code words, the minimum of candidate code words must be eliminated, such as to make it impossible for pairs identified in the course of the preceding test to be present. Still it is necessary for a sufficient number of code words to remain. The operation may be begun again, taking as a flag candidate each of the code words of the set being considered.

In the case of the 8B/10B code, it has been impossible to find a flag of 10-bit length that meets all the necessary criteria, but that does not prejudice the result in the case of other codes including longer words.

If as in the above example no flag having the same length as a code word is found, then it will be necessary to search for flags having a length equal to two code words. For the 8B/10B code, flags comprising 20 bits will now be sought.

The method of searching for flags will be as follows:

(a) As above, the list of candidate code words comprising 10 bits is compiled.

(b) Then, a list of flag candidates obtained by the selection of 20-bit words, satisfying the following conditions, is compiled:

they are formed of two 10-bit words, m1 and m2, concatenated in this order:

m1 and m2 contain no more than four consecutive logical ones or four consecutive logical zeroes;

neither the beginning of m1 nor the end of m2 contains more than two consecutive logical ones or more than two consecutive logical zeroes;

the end of m1 and the beginning of m2 both contain more than two consecutive logical ones or more than two consecutive logical zeroes.

(c) Each flag candidate is tested, by determining the Hamming distance between each of the candidate code words and all the sequences of 10 consecutive bits that can be extracted from the flag candidate tested.

(d) If the Hamming distance between a tested code word candidate and each of these sequences extracted from the flag candidate is greater than or equal to 2, then the candidate code word is admitted into the code.

(e) If there is at least one sequence at a Hamming distance equal to 1, then for each of these sequences the first and second set of bits comprising the first and last bits, respectively, of the flag candidate that do not belong to the sequence are considered, and a first list, including the candidate code words that end with the first set of bits, and a second list, including those that begin with the second set of bits are compiled. If one of the two lists is empty, the tested code word is retained; if neither list is empty, then going by the rule of alternation of weights, all the possible triplets comprising one word from the first list, the tested code word and one word from the second list are formed.

(f) If there is at least one sequence that is at a zero Hamming distance, then for each of these sequences the first and second set of bits are considered, comprising the first and last bits, respectively, of the flag candidate that do not belong to the sequence, and a first list, comprising the candidate code words that end exactly at or one bit away from the first set of bits, and a second list, comprising those that begin exactly at or one bit away from the second set of bits, are compiled.

Going by the rule of alternation of weights, all the possible triplets comprising one word from the first list, the tests code word and one word of the second list are formed, excluding all the triplets that include two words at a distance of 1, each being taken from one of the above lists.

If no triplet can be formed, then the tested code word is retained.

(g) After having performed operations d, e and f for all the candidate code words, all the triplets that have been formed are considered, and at least one of the candidate code words that appear in each of these triplets is cancelled, such that no triplet any longer exists.

If the number of code words remaining after the aforementioned elimination has been done is greater than $2^M$, then the flag candidate can be used as a flag, on the condition that it is associated with code words that have been retained. If the number of code words is inadequate, then another flag must be tested, taken from among the list of flag candidates by again performing the operations c–g above.

An example of a procedure enabling the choice of a code and a set of compatible flags by successively introducing constraints will illustrate the possibilities that the above-described method affords. The choice of the constraints, which among other factors depends on considerations of the transmission protocol used, the performance desired, and the accessible technology, must be left to one skilled in the art. It can be specified that the flags must comprise two 10-bit words both having a zero charge. This constraint, added to those mentioned above in (b), leads to defining a set of 338 flag candidates. Applying the above method to these candidates makes it possible, this time, to demonstrate that each one can be associated with more than 256 of the 304 candidate code words, and can be a flag. Now a constraint affecting the candidate code words is added: The management of the charge is such that in a message made up of concatenated code words, the cumulated charge, measured at the boundaries between words, can have only two values, 0 and +2. If one of the 180 words having an inherent weight of zero, when the initial weight is zero, is encoded, the measured weight fluctuates around the value of 0. It is generally limited to −2, but nine of the 180 words will make it attain the value of −3. Likewise, if the initial weight is +2, the instantaneous weight is generally limited to +4, but nine of the 180 words will make it attain the value of +5. If the 18 singular words are taken away from the set of 304 candidate code words, there remains 162 words having a zero charge and 124 pairs of complementary words having a weight of ±2. Among the 338 flag candidates, 222 are still compatible with more than 256 retained candidate code words. Finally, in each encoded message not including a flag, the instantaneous charge is still included between +4 and −2; a code having 7 charge levels, according to the convention generally used, has now been defined.

The sets including a flag and its associated code words are made up in this way. To make up a code having a plurality of flags, it is sufficient to find a plurality of compatible sets, that is, such that they include at least as many code words in common as the number of possible data words, and such that the Hamming distance between two flags of any kind is at least equal to 2. In the case of the 8B/10B code and limiting the number of charge levels necessary for encoding data to 7, it is possible to find up to six flags of 20 bits having a zero charge, associated with more than 256 code words, each of the flags being at a Hamming distance of at least 2 from each of the other flags.

Considering the constraint of 7 charge levels, one thus finds 795 different codes compatible with 2 flags, and 56 different codes compatible with 6 flags.

For any number of flags not exceeding 6, one can thus choose from among many solutions. For example:

one can proceed via sets of flags that are compatible with more than 256 words, and the excess words can be used to assure inter-frame filling and encoding of Boolean data;

one can specify that the logical distance between flags is greater than 3, or 4, etc;

one can limit the number of charge levels necessary for encoding the flags in the frames;

one can choose a set of flags such that the logic required for detecting them is minimal; or one can choose a code such that if the transcoding functions are realized by combinatory logic, this logic is optimized in terms of volume or performance. An example of a code accepting four flags is given in the table below. In this table the flags, the "filler" and the code words are expressed in decimal values; the data words are expressed in hexadecimal values in column D; and the bits a–j of the code word are represented in binary form.

ENCODING TABLE

FILLER = 341
FLAGS: 385953–385986–770977–771010

| D | CODE | abicdefjgh | D | CODE | abicdefjgh |
|---|------|------------|---|------|------------|
| 00 | 171 | 0010101011 | 80 | 817 | 1100110001 |
| 01 | 173 | 0010101101 | 81 | 818 | 1100110010 |
| 02 | 174 | 0010101110 | 82 | 820 | 1100110100 |
| 03 | 179 | 0010110011 | 83 | 837 | 1101000101 |
| 04 | 181 | 0010110101 | 84 | 838 | 1101000110 |
| 05 | 182 | 0010110110 | 85 | 841 | 1101001001 |
| 06 | 185 | 0010111001 | 86 | 842 | 1101001010 |
| 07 | 186 | 0010111010 | 87 | 844 | 1101001100 |
| 08 | 203 | 0011001011 | 88 | 849 | 1101010001 |
| 09 | 205 | 0011001101 | 89 | 850 | 1101010010 |
| 0A | 206 | 0011001110 | 8A | 852 | 1101010100 |
| 0B | 211 | 0011010011 | 8B | 425 | 0110101001 |
| 0C | 213 | 0011010101 | 8C | 433 | 0110110001 |
| 0D | 214 | 0011010110 | 8D | 142 | 0010001110 |
| 0E | 217 | 0011011001 | 8E | 457 | 0111001001 |
| 0F | 218 | 0011011010 | 8F | 434 | 0110110010 |
| 10 | 220 | 0011011100 | 90 | 466 | 0111010010 |
| 11 | 227 | 0011100011 | 91 | 652 | 1010001100 |
| 12 | 229 | 0011100101 | 92 | 681 | 1010101001 |
| 13 | 230 | 0011100110 | 93 | 404 | 0110010100 |
| 14 | 233 | 0011101001 | 94 | 713 | 1011001001 |
| 15 | 234 | 0011101010 | 95 | 150 | 0010010110 |
| 16 | 236 | 0011101100 | 96 | 306 | 0100110010 |
| 17 | 241 | 0011110001 | 97 | 204 | 0011001100 |
| 18 | 242 | 0011110010 | 98 | 438 | 0110110110 |
| 19 | 244 | 0011110100 | 99 | 197 | 0011000101 |
| 1A | 299 | 0100101011 | 9A | 690 | 1010110010 |
| 1B | 301 | 0100101101 | 9B | 141 | 0010001101 |
| 1C | 302 | 0100101110 | 9C | 553 | 1000101001 |
| 1D | 307 | 0100110011 | 9D | 685 | 1010101101 |
| 1E | 309 | 0100110101 | 9E | 390 | 0110000110 |
| 1F | 310 | 0100110110 | 9F | 721 | 1011010001 |
| 20 | 313 | 0100111001 | A0 | 166 | 0010100110 |
| 21 | 314 | 0100111010 | A1 | 329 | 0101001001 |
| 22 | 316 | 0100111100 | A2 | 180 | 0010110100 |
| 23 | 331 | 0101001011 | A3 | 562 | 1000110010 |
| 24 | 333 | 0101001101 | A4 | 347 | 0101011011 |
| 25 | 334 | 0101001110 | A5 | 689 | 1010110001 |
| 26 | 339 | 0101010011 | A6 | 561 | 1000110001 |
| 27 | 342 | 0101010110 | A7 | 452 | 0111000100 |
| 28 | 345 | 0101011001 | A8 | 554 | 1000101010 |
| 29 | 346 | 0101011010 | A9 | 212 | 0011010100 |
| 2A | 348 | 0101011100 | AA | 337 | 0101010001 |
| 2B | 355 | 0101100011 | AB | 172 | 0010101100 |
| 2C | 357 | 0101100101 | AC | 330 | 0101001010 |
| 2D | 358 | 0101100110 | AD | 298 | 0100101010 |
| 2E | 361 | 0101101001 | AE | 149 | 0010010101 |
| 2F | 362 | 0101101010 | AF | 593 | 1001010001 |
| 30 | 364 | 0101101100 | B0 | 363 | 0101101011 |
| 31 | 369 | 0101110001 | B1 | 305 | 0100110001 |
| 32 | 650 | 1010001010 | B2 | 198 | 0011000110 |
| 33 | 370 | 0101110010 | B3 | 586 | 1001001010 |
| 34 | 372 | 0101110100 | B4 | 165 | 0010100101 |
| 35 | 395 | 0110001011 | B5 | 722 | 1011010010 |
| 36 | 397 | 0110001101 | B6 | 396 | 0110001100 |
| 37 | 403 | 0110010011 | B7 | 594 | 1001010010 |
| 38 | 405 | 0110010101 | B8 | 389 | 0110000101 |
| 39 | 406 | 0110010110 | B9 | 726 | 1011010110 |
| 3A | 409 | 0110011001 | BA | 426 | 0110101010 |
| 3B | 410 | 0110011010 | BB | 603 | 1001011011 |
| 3C | 412 | 0110011100 | BC | 714 | 1011001010 |
| 3D | 419 | 0110100011 | BD | 458 | 0111001010 |
| 3E | 421 | 0110100101 | BE | 682 | 1010101010 |
| 3F | 422 | 0110100110 | BF | 788 | 1100010100 |
| 40 | 428 | 0110101100 | C0 | 732 | 1011011100 |
| 41 | 436 | 0110110100 | C1 | 163 | 0010100011 |
| 42 | 453 | 0111000101 | C2 | 238 | 0011101110 |
| 43 | 454 | 0111000110 | C3 | 237 | 0011101101 |
| 44 | 460 | 0111001100 | C4 | 610 | 1001100010 |
| 45 | 465 | 0111010001 | C5 | 411 | 0110011011 |
| 46 | 468 | 0111010100 | C6 | 742 | 1011100110 |
| 47 | 555 | 1000101011 | C7 | 153 | 0010011001 |
| 48 | 557 | 1000101101 | C8 | 609 | 1001100001 |
| 49 | 558 | 1000101110 | C9 | 154 | 0010011010 |
| 4A | 563 | 1000110011 | CA | 282 | 0100011010 |
| 4B | 565 | 1000110101 | CB | 228 | 0011100100 |
| 4C | 566 | 1000110110 | CC | 538 | 1000011010 |
| 4D | 569 | 1000111001 | CD | 356 | 0101100100 |
| 4E | 570 | 1000111010 | CE | 670 | 1010011110 |
| 4F | 587 | 1001001011 | CF | 354 | 0101100010 |
| 50 | 589 | 1001001101 | D0 | 486 | 0111100110 |

ENCODING TABLE-continued
FILLER = 341
FLAGS: 385953-385986-770977-771010

| D | CODE | abicdefgh | D | CODE | abicdefgh |
|---|------|-----------|---|------|-----------|
| 51 | 590 | 1001001110 | D1 | 748 | 1011101100 |
| 52 | 595 | 1001010011 | D2 | 147 | 0010010011 |
| 53 | 597 | 1001010101 | D3 | 802 | 1100100010 |
| 54 | 598 | 1001010110 | D4 | 219 | 0011011011 |
| 55 | 601 | 1001011001 | D5 | 476 | 0111011100 |
| 56 | 602 | 1001011010 | D6 | 531 | 1000010011 |
| 57 | 604 | 1001011100 | D7 | 658 | 1010010010 |
| 58 | 611 | 1001100011 | D8 | 534 | 1000010110 |
| 59 | 613 | 1001100101 | D9 | 349 | 0101011101 |
| 5A | 614 | 1001100110 | DA | 550 | 1000100110 |
| 5B | 617 | 1001101001 | DB | 657 | 1010010001 |
| 5C | 618 | 1001101010 | DC | 490 | 0111101010 |
| 5D | 620 | 1001101100 | DD | 549 | 1000100101 |
| 5E | 625 | 1001110001 | DE | 730 | 1011011010 |
| 5F | 394 | 0110001010 | DF | 605 | 1001011101 |
| 60 | 626 | 1001110010 | E0 | 729 | 1011011001 |
| 61 | 628 | 1001110100 | E1 | 402 | 0110010010 |
| 62 | 651 | 1010001011 | E2 | 745 | 1011101001 |
| 63 | 653 | 1010001101 | E3 | 401 | 0110010001 |
| 64 | 659 | 1010010011 | E4 | 746 | 1011101010 |
| 65 | 661 | 1010010101 | E5 | 459 | 0111001011 |
| 66 | 662 | 1010010110 | E6 | 340 | 0101010100 |
| 67 | 665 | 1010011001 | E7 | 139 | 0010001011 |
| 68 | 666 | 1010011010 | E8 | 308 | 0100110100 |
| 69 | 668 | 1010011100 | E9 | 195 | 0011000011 |
| 6A | 675 | 1010100011 | EA | 201 | 0011001001 |
| 6B | 677 | 1010100101 | EB | 596 | 1001010100 |
| 6C | 678 | 1010100110 | EC | 315 | 0100111011 |
| 6D | 684 | 1010101100 | ED | 813 | 1100101101 |
| 6E | 692 | 1010110100 | EE | 649 | 1010001001 |
| 6F | 709 | 1011000101 | EF | 243 | 0011110011 |
| 70 | 710 | 1011000110 | F0 | 393 | 0110001001 |
| 71 | 716 | 1011001100 | F1 | 821 | 1100110101 |
| 72 | 724 | 1011010100 | F2 | 435 | 0110110011 |
| 73 | 781 | 1100001101 | F3 | 332 | 0101001100 |
| 74 | 787 | 1100010011 | F4 | 187 | 0010111011 |
| 75 | 789 | 1100010101 | F5 | 582 | 1001000110 |
| 76 | 790 | 1100010110 | F6 | 581 | 1001000101 |
| 77 | 793 | 1100011001 | F7 | 556 | 1000101100 |
| 78 | 794 | 1100011010 | F8 | 697 | 1010111001 |
| 79 | 796 | 1100011100 | F9 | 698 | 1010111010 |
| 7A | 803 | 1100100011 | FA | 300 | 0100101100 |
| 7B | 805 | 1100100101 | FB | 845 | 1101001101 |
| 7C | 806 | 1100100110 | FC | 853 | 1101010101 |
| 7D | 809 | 1100101001 | FD | 854 | 1101010110 |
| 7E | 810 | 1100101010 | FE | 739 | 1011100011 |
| 7F | 812 | 1100101100 | FF | 156 | 0010011100 |

It is unnecesary to describe in detail other particular solutions discovered by the systematic search above as one skilled in the art need merely follow the method described. It will be understood that the search for the solution is greatly facilitated by utilizing the data processing means currently used in industry. Among the various solutions, one skilled in the art will be able to select the one that is appropriate for the application he is working with.

The determination of the code words and flags comprises the essential step in defining the method of transmission according to the invention. The method can then be completed by means of the supplementary characteristics.

In particular, multiplexing and demultiplexing of data from the terminal can be provided in the case where the data comprise what is known as "user words", having a length equal to a multiple of the length of one data word.

Finally, it is usual to provide the transmission apparatus with an error detection mechanism, with which for each frame received, it is possible to confirm with a slight probability of error that the data contained in the frame have (or have not) been modified by a transmission error. The most widespread transmission methods use serial modulation codes, for example of the Manchester type, where the error propagation is zero; an error that inverts one of the code bits is translated, after decoding, into an error that inverts only one data bit.

For error detection (and possibly correction), a cyclical binary code is generally associated with these modulation codes. The best known of these cyclical binary codes are the following:

extended Hamming codes, enabling detection of an error relating to 1, 2 or 3 bits;

FIRE codes making it possible to handle the case where the signal is flawed by an error relating to a unique packet of bits;

BCH codes, which are a generalization of Hamming codes and with which errors relating to a higher number of isolated bits can be detected.

In the case of the invention, the modulation code operates on groups of M bits, such that the error propagation is confined to the boundaries of groups of M bits.

In that case, it is advantageous to choose error detection or correction codes that are no longer binary but instead are built upon symbols of M bits (or multiples of M bits), on the condition that the boundaries of the symbols of the correction code coincide with the boundaries of the modulation code groups.

Reed-Solomon codes belong to this category. They also have the advantage of being capable of processing (both detecting and correcting) error situations affecting a plurality of symbols of M bits distributed within a frame.

Reed-Solomon codes have the further advantage of being able to be implemented in a parallel manner (parallel to M bits), that is, in a manner homogeneous with what has been said for the modulation code.

For the reasons given above, high data rate transmissions call for modulation codes of the MB/NB group code type (for example, 8B/10B), for which error propagation is naturally M bits: inversion of one encoded data bit can result, after decoding, in inversion of M data bits.

Until now, this development has not resulted in changes in terms of the error detection code. In particular, the FDDI (Fiber Distributed Data Interface) draft standard of the ANSI, and the IBM article cited above, recommend the use of binary cyclic codes, such as the FIRE code, for error detection. Binary cyclic codes still used in association with group codes for modulation, are placed in an environment where they are least efficient: thus, the security of transmissions is less. Moreover, with this kind of association of codes, it is difficult to optimize the transcoding logic, since the modulation code has to be implemented with parallel logic, while the detector code must be implemented with serial logic performed on the non-encoded data.

Accordingly, the invention is also directed to the association of an error detection code of the Reed-Solomon family of codes, with the modulation by an MB/NB group code. Once again, cyclical codes are involved, but with the difference that since the binary codes operate serially on the data bits, the Reed-Solomon codes operate in parallel on symbols having M bits (or multiples of M bits). Their area of maximum efficiency is for error bursts that are scarce and confined in symbols of M bits (or multiples of M bits).

In the case where the user words are multiplexed prior to encoding and transmission, Reed-Solomon coding is performed directly, beginning with the user words; the multiplexing then relates equally well to the user words and to the key words, which have the same length as the user words.

It is needless to describe in detail the methods of encoding and error detection of the Reed-Solomon type, since Reed-Solomon theory and practice are well known per se.

The execution of the transmission method according to the invention will now be described.

FIG. 1 shows transmission and reception apparatuses that can be incorporated into a terminal of a computer network. This figure has already been described above, in terms of the elements enabling better comprehension of the transmission method. Nevertheless, it can be added that the transmission and reception apparatuses communicate with the processor of the terminal via the intermediary of an interface and protocol management unit 11, which can be associated with error detection or correction devices. In particular, it can be provided with a key generator 15 that functions during transmission, and with an error detector 17 that functions during reception. From the interface 11, the control circuit of the transmission and reception apparatuses also receives control signals CD, FL originating in the processor of the terminal. Similarly, the reception apparatus sends control signals C to the processor of the terminal.

Figure 2:
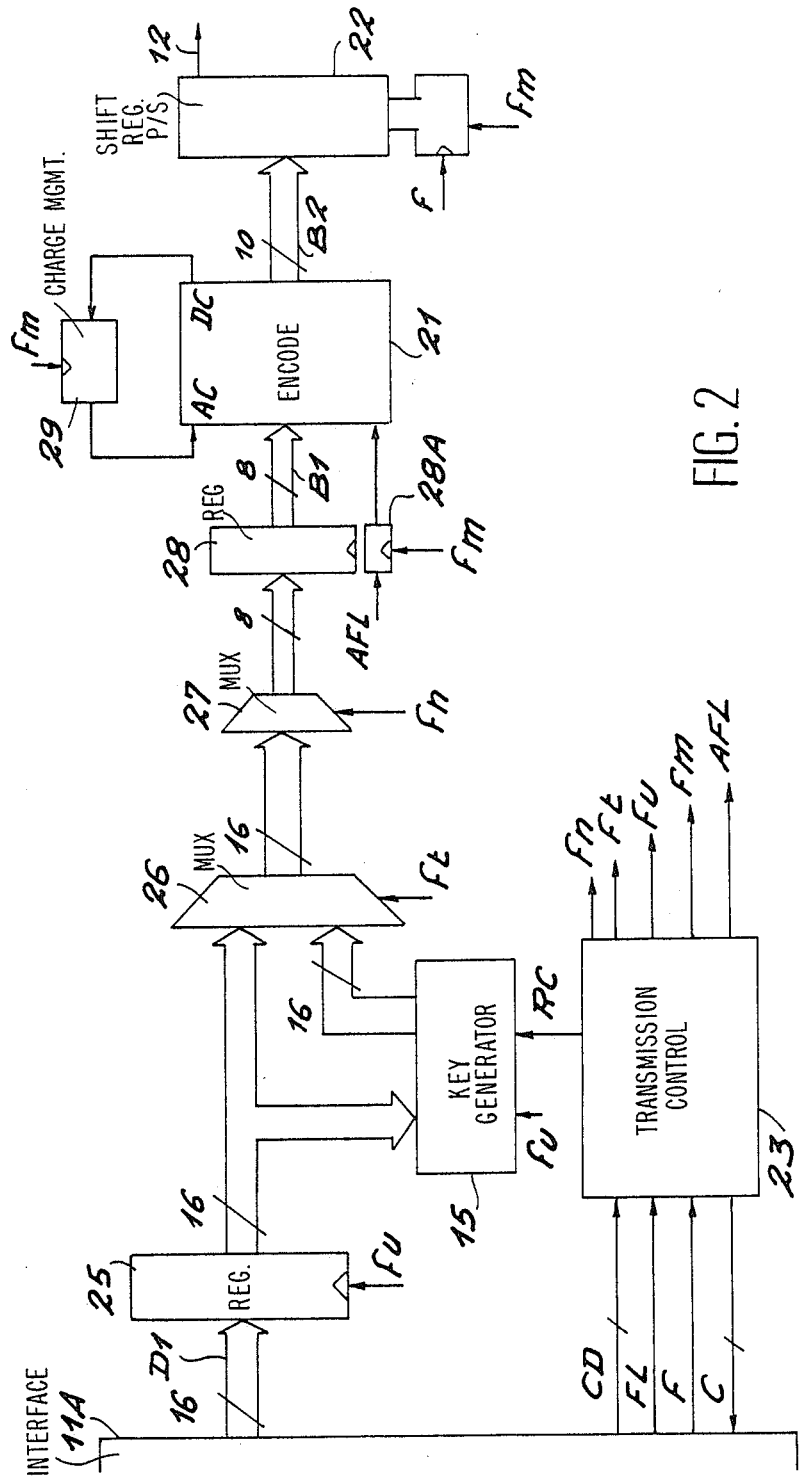
FIG. 2 shows a transmission apparatus according to the invention, in greater detail.

FIG. 2 shows a transmission apparatus in greater detail. The transmission interface 11A communicates with the transmission apparatus via a data bus D1, by way of which 16-bit user words are sent to the transmission apparatus. The interface 11A also emits the control signals CD, FL. The signals CD are signals that enable initialization and shutoff of the transmission apparatus. The signals FL are indicative of the flags that are to be transmitted and are generated by the protocol management device of the interface 11A. The interface 11A also includes a local clock that furnishes clock signals having a frequency f. All these signals are transmitted to a transmission control device 23, which may also furnish control signals C, such as acknowledgement signals or error signals indicating malfunction of the transmission apparatus.

The bits of the same user word are transmitted in parallel via the bus D1 to an input register 25. The output of the input register 25 is connected first to the key generator device 15 and second to the input of a multiplexer 26 that enables selection of either user words or key words furnished by the generator 15. Thus the output of the key generator 15 is connected to the input of the multiplexer 26. In the embodiment shown, a user word includes a plurality of data words, and so the output of the multiplexer 26 is connected to the input of a second multiplexer 27, the output lines of which are connected to the input of a register 28. The output of the register 28 creates a bus B1 which is connected to the input of the encoding device 21, the output of which is connected to a bus B2. Thus in the case of encoding of the 8B/10B type, the bus B1 will include 8 lines in parallel, and the bus B2 will include 10 lines in parallel. Finally, the bus B2 is connected to the parallel input of a shift register 22, which comprises a parallel/serial conversion circuit. This shift register 22 has a serial output 12, a clock input that receives the clock signal f, and an input for controlling parallel loading of the data present on the bus B2. The encoding circuit 21 has a supplementary output DC, which is connected to the input of a charge management device 29. The output of the device 29 is connected to a supplementary input AC of the encoding device 21. The role and structure of the charge management device 29 will be explained later.

The key generator 15 is of the Reed-Solomon type. These generators are well known in the art of error detection and correction, in particular in magnetic disk applications.

Accordingly, there is no need to describe this device in further detail. Nevertheless, it should be remembered that a key generator of the Reed-Solomon type operates on the principle of division of a polynomial, the coefficients of which are the words of the message to be transmitted, by a specific polynomial of the Reed-Solomon code. To do so, shift registers are used which operate on a plurality of bits in parallel with feedback loops, such as to provide an automatic division by the polynomial of the code. In the example of FIG. 2, the user data words include 16 bits. The polynomial of the Reed-Solomon code can be of the form $X^2+X(T+I)+T$, where T is an element of a Gallois field $F(2^{16})$, and I is the neutral element of this field. With a quadratic polynomial of this kind, the key generated by a message will be made up of the remainder from the above-mentioned division by this polynomial, in the form of two words of 16 bits present in two registers of the key generator, and these two key words are concatenated at the end of the frame.

The control device 23 generates synchronization signals ft, fu, fm, fn, which serve to synchronize and control elements such as the registers and multiplexers of the transmission and reception apparatuses. The control device 23 also generates a flag generation control signal AFL. This signal AFL is applied to the input of a toggle 28A, the output of which is connected to an additional input of the encoding device 21. Finally, the control device 23 furnishes signals RC for control of the key generator 15.

The function of the transmission apparatus shown in FIG. 2 will now be described. First, it should be remembered that a frame that is to be transmitted comprises a plurality of parts. It includes, first, a delimiter for the beginning of a frame, which is a particular flag; the message itself; and a delimiter for the end of the frame, which is another particular flag. Between these frames, the transmitter generates filler characters, or fillers, intended for maintaining the function of the clock recovery circuit of the receiver. The message itself comprises a succession of user words having a fixed length, possibly followed by a certain number of key words. Thus the transmitter control device must be aware, first, of the fact that flags are transmitted, and second, of the length of the message or the total number of user words to be transmitted. This information is furnished by the control signals FL and CD. As a function of these signals, the control device 23 generates the signals required for correct sequencing of the transmission circuits. In particular, the control circuit 23 generates a control signal fu, having the frequency of the user words. This signal fu serves to validate the input register 25. It also serves to synchronize the key generator device 15. The signal ft serves to control the multiplexer 26. This signal ft appears at the end of the transmission of one complete block of user data and authorizes the transmission of the key words memorized in the key generator 15.

In the embodiment of FIG. 2, the data words to be encoded comprise 8 bits, while the user data words comprise 16 bits. Thus one user word is sent in the form of two successive 8-bit words, because of the multiplexer 27. This multiplexer 27 is controlled by a signal fn derived from the signal fm, the frequency fm of which is known as the "word frequency", which is equal to a multiple of the user word frequency fu. A signal of the same frequency and also called fm is used for synchronizing the input register 28 and the toggle 28A, the charge management device 29 and the shift register 22. It will be noted that the multiplexers 26 and 27 can be replaced with a single multiplexer that includes 32 input lines and 8 output lines, and controlled as a function of two signals having the frequencies ft and fn, respectively.

Now that the control signals have been defined, the functioning of the transmitter when a message is transmitted will be described. The control circuit 23 first receives a transmission control signal originating from the interface 11A, and the control circuit 23, based on the clock signal f, triggers the generation of the signals fm, fu, fn and ft. The control device receives a flag signal FL, and a signal AFL is applied to the input of the toggle 28A. The signal fu validates the writing of the register 25 and thus the key generator 15 at the clock rate of the user word frequency. The signal ft authorizes the transfer of the data contained in the input register 25 to the multiplexer 27. The signal fn permits the selection, in alternation, of the first and last 8 bits of the user word received. Similarly, a signal fm authorizes the writing in the register 28. It will be appreciated that the signals ft, fu, fm have frequencies within predetermined ratios, but the signals having the same reference symbols may possibly have phase lags making it possible to take into account delays caused by each stage of the circuit. For example, the signal fm applied to the register 28 will have a phase lead with respect to the signal fm applied to the control input of the shift register 22.

When the data block to be transmitted has been encoded and transmitted, the control circuit 23 sends the signal RC to the key generator device 15, which allows reading of the registers containing the key words. Simultaneously, the control device 23 sets the signal ft so that the multiplexer 26 links the output of the key generator 15 to the input of the multiplexer 27. Then the key words are encoded in the same way as data words are. In this embodiment it may be noticed that the shift register 22 operates at the highest frequency f. If, for instance, f is set at 200 MHz, the devices of the transmitter which are clocked by fm will operate at 20 MHz only. The shift register 22 could then be implemented in ECL technology, the remaining devices of the transmitter being implemented in CMOS technology. The data rate of the transmission channel would then be 160 M bit per second.

Figure 3:
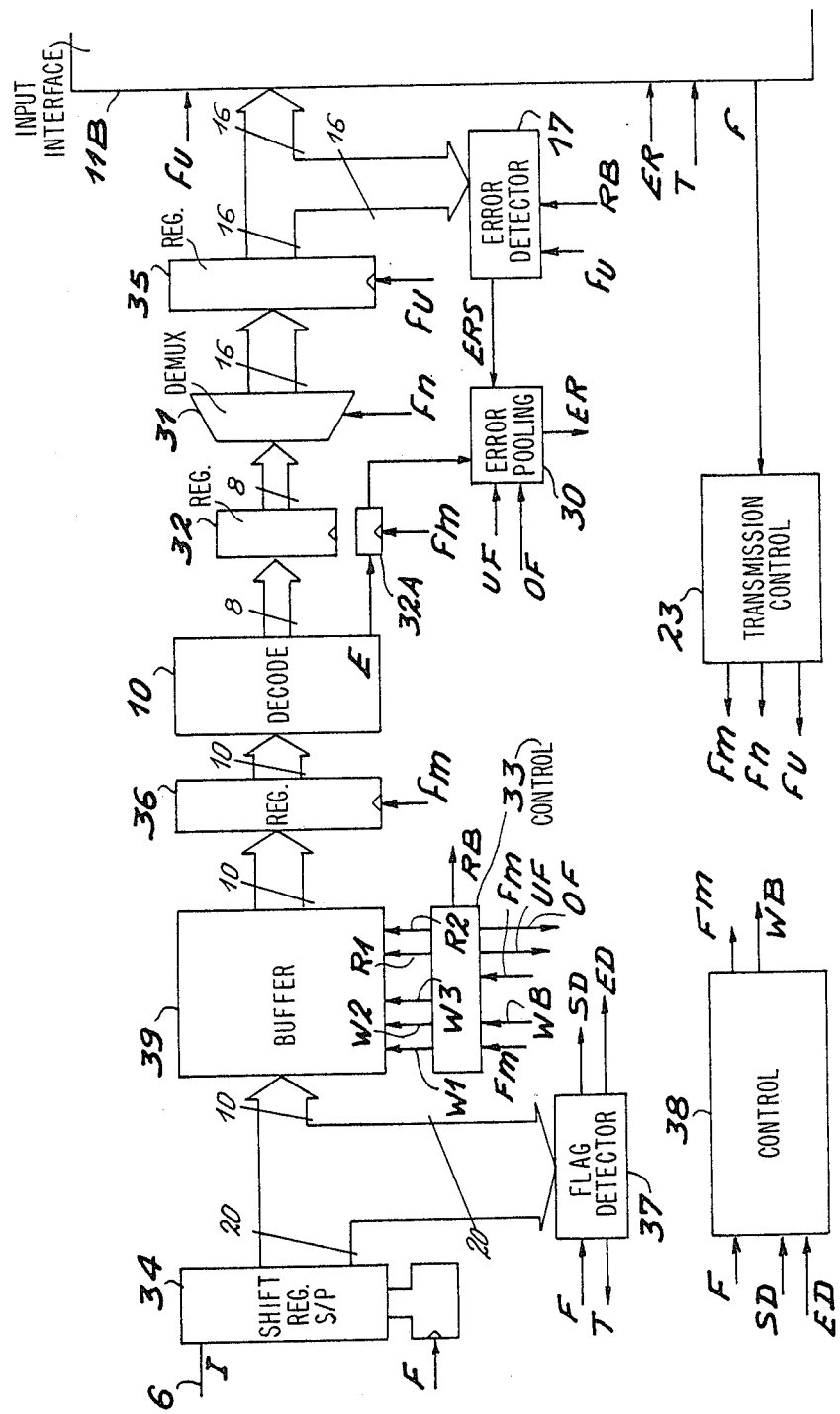
FIG. 3 shows a reception apparatus according to the invention, in greater detail.

FIG. 3 shows a reception apparatus according to the invention. The message issued by a transmitter, consisting in serial binary data propagates through a transmission channel. After conversion and amplification, these data reach the line 6; they are in synchronism with clock F recovered from the received serial signal. Line 6 is connected to the serial input I of a shift register 34, itself clocked by F and operated as a usual serial to parallel converter. Parallel output of the shift register 34 is connected to the input of the flag detection device 37. This device provides on its output the signals corresponding to the different flags detected, such as Start Delimiter SD, End Delimiter ED, possibly a token T used, for instance, in ring networks. According to the example shown in FIG. 3 the code involved is an 8B/10B associated with 20-bit flags. The shift register 34 accordingly is at least 20 bit long, because it must furnish as many bits at its parallel output as one flag can include. On the other hand, the code words contain only 10 bits and as a consequence only the first 10 stages of the shift register will be used to transmit the code words. Thus, the first 10 stages of the shift register are connected to the input of a buffer device 39, the role of which is to shift from synchronization by the regenerated clock F to synchronization by the local clock f. The buffer device 39 is associated with a control circuit 33. The structure and function of the devices 39 and 33 will be explained in greater detail later in this description.

The output of the buffer device 39 is connected to the input of a register 36 that is synchronized by a signal fm, called the local word clock. The output of the register 36 is connected to the input of the decoder 10. Thus, in the example given, the decoder receives 10 bits in parallel at its input and furnishes 8 bits in parallel at its output, corresponding to a decoded data word. The decoder 10 also includes an additional output E that is assigned to an error signal. The decoded data words emitted by the decoder 10 are received at the input of a register 32. Similarly, the error signal is received at the input of a toggle 32A. The register 32 and the toggle 32A are also synchronized by the signal fm. The output of the register 32 is connected to the input of a demultiplexer 31, which enables transforming the 8-bit words leaving the decoder 10 into 16-bit words. An 8-to-16 demultiplexer of this kind is mentioned solely by way of example in the particular case where the data words and user words are 8-bit and 16-bit words, respectively. It will be understood that the realization of the demultiplexing can easily be generalized in any case where the user words include a number of bits equal to a multiple of the number of bits in the data words.

The output of the demultiplexer 31 is then connected to another register 35 comprising 16 flip flops. The output of this register is connected first to the input interface 11b of the terminal and second to an error detection circuit 17.

The reception apparatus of FIG. 3 also includes the control circuit 38 and the control circuit 23 already mentioned in connection with FIG. 2. The circuit 38 receives the regenerated clock signal F and signals SD and ED indicating the presence of the beginning and end of a frame, respectively. As a function of these input signals, the circuit 38 furnishes, on the one hand, synchronization signals Fm corresponding to the received word frequency; this circuit also furnishes a writing control signal WB for the buffer device 39. The signals Fm and WB serve as input signals to the control circuit 33 of the buffer device 39. It will be remembered that the circuit 23 receives the local clock signal f and furnishes control signals fn for the demultiplexer 31 and local word clock signals Fm obtained on the basis of the local clock f. The signals fm control the register 36, the register 32 and the toggle 32A. It will be apparent that the signals applied to the register 36, the register 32 and the demultiplexer 31, respectively, must be adequately phase shifted so as to take into account the delays caused by the passage of the various elements of the circuit. Finally, the circuit 23 furnishes a user word clock signal Fu, which is applied to the clock input of the register 35 and also serves as a synchronization signal for the error detection circuit 17.

In an important feature of the invention, the error detection circuit 17 is an error detector of the Reed-Solomon type. In a manner known per se, Reed-Solomon error detectors comprise, in the present example, two 16-bit registers, with feedback loops comprising a two-stage shift device with which it is possible to realize a divisor by the polynomial of the Reed-Solomon code.

To realize the error detector, the 16 outputs of each register are connected to the input of an OR gate associated with the corresponding register. At the end of the message, the outputs of the OR gate indicate the existence of any errors. If this detector recognizes an error in the message transmitted, it furnishes a signal ERS to the input of the circuit 30, which pools all the errors detected at the level of the reception apparatus. More particularly, it receives the signal E coming from the decoder 10. It also receives the signals OF and UF coming from the control circuit 33 for the buffer device 39. These two signals OF and UF indicate that the capacity of the buffer device has been exceeded. The error signals ERS, E, OF, UF are pooled in the circuit 30, which furnishes a global error signal ER to the interface 11B.

To describe the function of the reception apparatus, it will first be recalled that the signals received form a frame, successively comprising a Start Delimiter SD, data words, key words, and an End Delimiter ED. In the example described, the markers SD and ED include 20 bits. Before decoding, the error detection key is formed from two 20-bit words.

The signals coming from the transmission channel enable adjustment of the frequency and phase of the received clock signal F. This signal F controls the function of the shift register 34, which memorizes 20 binary data that have been received, and these data shift one stage per clock pulse F.

Since the Start Delimiter is present in the register 34, the flag detector 37 recognizes it and delivers the signal SD to the control circuit 38. The control circuit 38 permanently furnishes a word received clock signal Fm having a frequency equal to one-tenth of the frequency F. In response to the signal SD and after a delay Tm corresponding to 10 clock periods F, the circuit 38 furnishes the signal WB. This signal WB activates the control circuit 33, the function of which will be described in detail later. The circuit 33 then furnishes writing commands W1, W2, W3 for the buffer 39. The signal fm is a permanent local word clock signal having a frequency equal to one-tenth the frequency of the local clock f. This signal fm is received by the control circuit 33, which furnishes the reading signals R1, R2 for the buffer 39 as well as the signal RB that indicates that the words of one received frame are present at the output of the buffer 39. The mode of operation of these circuits will be described later. The local word clock fm also controls the registers 36, 32 and the toggle 32A, such that the code words are decoded by the decoder 10 in synchronism with the local word clock signals fm.

As was the case with the transmitter described above, the signal fn that controls the demultiplexer 31 shuttles between the values 0 and 1 at each clock pulse fm. Thus the register 35 will be loaded with 16-bit words formed on the basis of two 8-bit data words. The register 35 is controlled by the user word clock signal fu, which has a frequency that is one-half the frequency fm.

Thus the user words emitted by the demultiplexer 31 and the register 35 are processed by the error detector 17 synchronized by the signal fu. The error detector 17 receives the signal RB, which indicates the end of the frame received, from the control circuit 33.

When the flag detector 37 recognizes the presence of the End Delimiter, it delivers the signal ED to the circuit 38.

After a time Tm following the reception of this signal, the circuit 38 sets the signal WB to zero. After a time on the order of 1.5 Tm following this event, the circuit 33 sets the signal RB to zero.

Figures 4A, 4B:
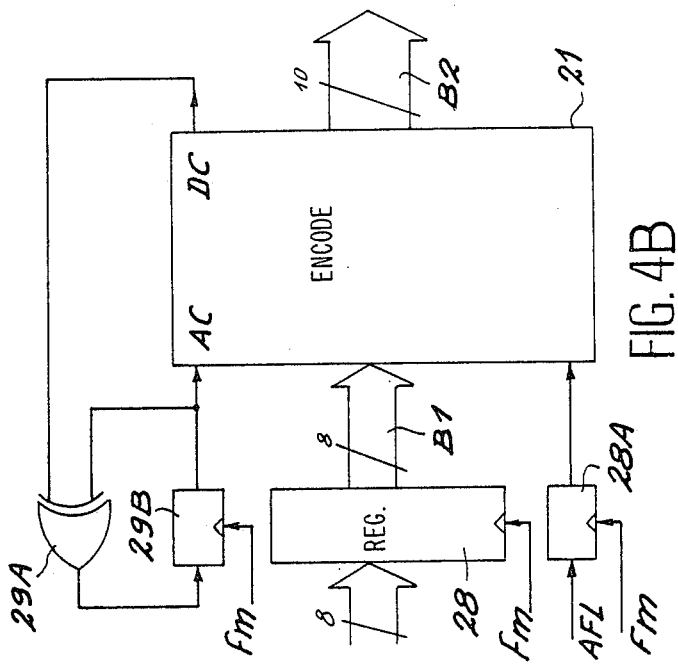
FIGS. 4A and 4B show the organization and an embodiment of an encoding device according to the invention.

FIGS. 4A and 4B will provide a better explanation of the structure and function of the encoding device 21 shown in FIG. 2.

The encoding device 21, the register 28 and the toggle 28A already mentioned in connection with FIG. 2 are found in FIG. 4B. In a particular embodiment, the encoding device simply comprises a memory, for example a read-only memory or a programmable memory, which at its output delivers 11-bit words addressed by 10-bit words. Among the ten address lines of the memory 21, eight form the bus B1 used for receiving data words to be encoded. One additional address line is connected to the output of the toggle 28A that has already been described, and a tenth address line AC receives the output signal of the charge management device 29. This charge management device 29 simply comprises an exclusive-OR gate 29A, the output of which is connected to the input of a toggle 29B; the output of this toggle is connected to the address line AC of the memory 21. The exclusive-OR gate 29A is connected at its first input to the output DC if the memory 21, and its second input is connected to the output of the toggle 29B. The toggle 29B is synchronized by the word clock signal fm.

This kind of arrangement of the memory 21 enables it to generate both the flags and the code words. In fact, as a function of the signal AFL that is received and of input words present on the bus B1, the memory 21 will furnish at its output, on the bus B2, a 10-bit word corresponding to one-half a flag. On the next edge of the word clock signal, the memory will furnish the other ten bits forming the end of the flag. When the address input AFL is no longer validated, the memory furnishes at its output code words that have been read at the location corresponding to the eight address bits coming from the register 28. Thus the memory 21 will make one associated code word correspond to each data word of the register 28.

In order to explain the function of the charge management device, it will be appropriate to describe the internal configuration of the data contained in the memory 21. FIG. 4A illustrates a particular case of an 8B/10B code in which there are 152 data words that can be associated with 152 code words having a zero charge. These data words are indicated by the symbols M0, M1, ... M151, and each of these data words is associated with one correspnding code word TZ0, TZ1, ..., TZ151. The other data words M152 ... M255 are those that correspond to code words having a non-zero charge, that is, TP0, TP1, ... TP103, or TM0, TM1, ... TM103, respectively. As a function of the value AC memorized in the toggle 29B, the data words associated with code words having a non-zero charge will address code words having a positive charge TP0 ... TP103 or a negative charge TM0 ... TM103. Moreover, depending on whether or not the addressed code word is a code word having a zero charge, the additional bit DC will assume the value of logical 0 or 1, respectively. After these explanations of the configuration of the data in the memory 21, the function of the charge management circuit 29A, 29B should be apparent. If it is assumed, beginning at a state where the logical value memorized in the toggle 29B is equal to 0, that the first data word to be encoded corresponds to a code word having a zero charge, then the new value of AC is 0. As long as the following code words have a zero charge, the value of AC will remain equal to 0. As soon as a data word corresponds to a code word having a non-zero charge, then since AC has been assumed to be equal to b 0, the code word corresponding to this data word will have a positive charge. Simultaneously the output of the gate 29a will get the value 1. Then, if a new data word corresponds to a code word having a zero charge, the value of AC will remain unchanged and thus will retain the value 1. AC will retain this value as long as data words corresponding to code words having a zero charge appear at the input. As soon as a data word corresponding to a code word having a non-zero charge appears, then since AC has the value 1 the new code word corresponding to this data word will have a charge opposite that of the preceding code word having a non-zero charge. Since AC and DC have had the value 1, the toggle will be loaded with a new value of AC equal to 0. It can be easily verified that the same mechanism is obtained if a value of AC equal to 1 is assumed at the outset. Thus it is certain that no matter what the initial conditions are, a data word associated with a word having a non-zero charge will always be encoded by the one of the two code words associated with this word that has a charge opposite the charge of the preceding code word having a non-zero charge that had appeared before it.

It will be appreciated that another kind of embodiment is conceivable in which instead of a memory, hard-wired logic circuits that perform the same function can be used. However, in that case a hard-wire encoding circuit would be specific to a particular code. The use of a memory, on the other hand, makes it possible to use exactly the same circuits for all the codes that meet the criteria selected. In this case, only the contents of the memory need to be modified, if one wishes to select a different code.

The decoding circuit 10 shown in FIG. 3 can also be realized using a memory. This memory is addressed by the 10 bits of the code word received and furnishes 8-bit data words at its output. Taking into account the encoding method as described above, it will be understood that the two charged code words associated with the same data word should address the memory at locations containing exactly the same value representing a unique data word.

In this embodiment using a memory, it is apparent that the decoding memory must contain 1024 8-bit words in order to decode only 356 data words. As a result, certain values of the address applied to the memory do not correspond to any data word provided in the code. According to one feature of the invention, this apparent disadvantage has been exploited in an original manner, but at the expense of one additional bit E per data word in the memory.

Figures 5A, 5B:
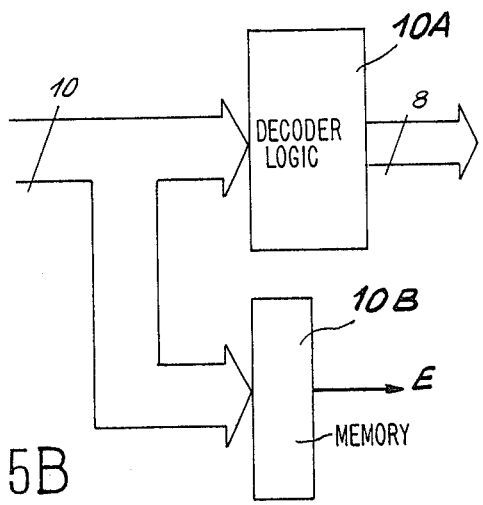
FIGS. 5A and 5B show the organization and an embodiment of a decoding device according to the invention.

To illustrate this, FIG. 5A shows the correspondence between the addresses C0, ..., C1023 of the memory 10 and the data D0, ..., D1023 associated with these addresses. Any address applied to the memory may or may not be a code word. If it is not, then an error has occurred, and it is important to be able to detect it. For example, assuming that C0, C1, C2 are code words respectively corresponding to the data D0, D1, D2, the additional bit E associated with the data word will be equal to 0, indicating thereby that the address applied corresponds to a code word. Contrarily, if because of a transmission error the 10 address bits received do not correspond to any code word, the additional bit E will assume the value 1. Thus the output line E of the memory 10 assumes a logical value as a function of the appearance of a word that does not belong to the code. This error signal will be transmitted via the circuit 30 to the receiver interface 11B.

A variant embodiment of the decoding device 10 is shown in FIG. 5B. As in the case of the encoding circuit, the use of a memory as the decoding device is not indispensable. The decoder can also be realized by means of a hard-wired logic circuit 10A. However, in this case again, it is possible to obtain an indication of an erroneous code word, as in the case of realization with a memory. All that need be done to do so is to connect the address lines from an auxiliary memory 10B to the input lines of the decoding circuit 10B. This auxiliary memory will then have as many address lines as input lines, and one binary word E will be associated with each address. For example, in the case where the code words include 10 bits, the memory 10B will have a capacity of 1024 bits. As in the foregoing embodiment, when an address is applied to the memory and does not correspond to any code word, the memory will furnish the value of logical 1 at its output. Contrarily, if the address does correspond to a code word, the output of the memory will have the value of logical 0.

Figure 6:
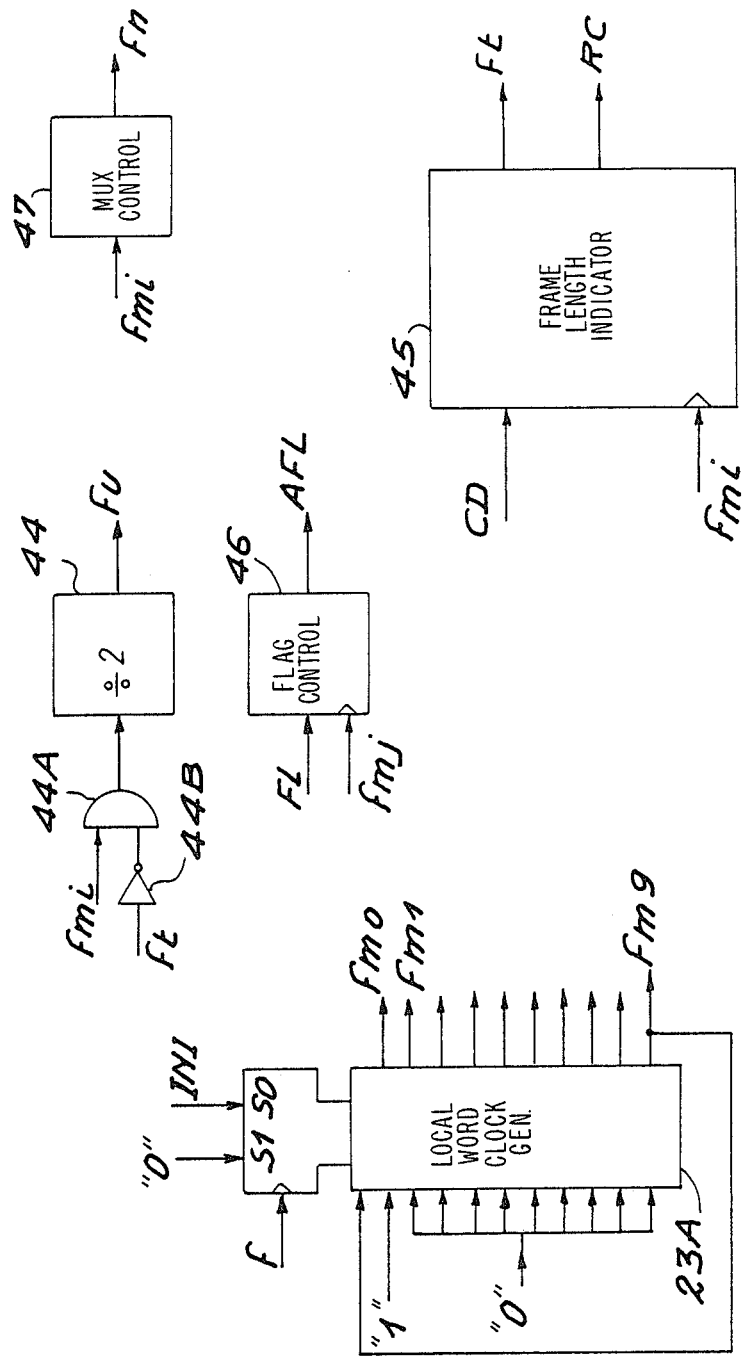
FIG. 6 shows an embodiment of a transmission control device according to the invention.

FIG. 6 shows certain circuits of the control device 23 of the transmission apparatus, in greater detail. A local word clock generator substantially comprises a shift register 23A. This register includes 10 stages, the parallel inputs of which are positioned at the value of logical 1 for the first input and at the value of logical 0 for the other nine inputs. This register includes 10 output lines fm0, fm1, ... fm9. The last output fm9 is fed back to the serial input of the shift register. The register also receives the local clock signal f at its clock input. The register further includes two control inputs S0, S1, the values of which dictate the functioning of the register. The input S1 corresponds to a command to hold the status of the register. As the hold function of the register is not used, the input S1 is constantly forced to the value of logical 0. When S0 receives the value of logical 0, the register is controlled for parallel loading. If S0 assumes the value of logical 1, the register is commanded to shift. Since the local word clock fm is permanent, the command S1 has the value of logical 0 only during the initial loading period, determined by the signal INI. Shift registers of this kind, which can be controlled in a parallel loading mode, a hold mode or a shift mode, are known in the art, and there is no need to describe their embodiment in further detail. The feedback of the last output fm9 to the serial input of the register has the effect of producing signals at the various outputs fm0 ... fm9 that have a frequency equal to one-tenth of the frequency F, these signals being phase shifted with respect to one another by a value equal to an integral multiple of the period of the local clock signal f. The signals fm0 ... fm9 comprise what has been called above the local word clock. The control circuit 23 also includes a frequency divider 44 dividing the frequency by 2 and at its input receiving the output signal of an AND gate 44A. The first input of the AND gate receives one of the word clock signals fmi. Its other input receives the output signal of an inverter 44B, the input of which receives the signal ft. The signal fu controls the register 25 and the key generator 15.

A circuit 46 which generates the flag control signal AFL applied to the toggle 28A associated with the encoder 21 receives a signal FL from the interface 11a indicating that the words to be encoded are flags. The circuit 46 also receives a word clock signal fmj. Upon reception of the signal FL, the circuit 46 positions the signal AFL at the value of logical 1 for the duration of emission of two data words.

The circuit 47, having the function of a toggle T, furnishes the signal fn for controlling the multiplexer 27 in response to the signal fmi emitted by one of the outputs of the shift register 23A.

A circuit assembly 45 generates the signals ft and RC as a function of the signal fmi and the signal DC coming from the transmission interface 1A, indicating the length of the frame to be transmitted.

The signal ft assumes the value of logical 1 when the last data word has been transmitted and retains this value for a duration corresponding to the transmission of two additional words. Thus for this duration, the multiplexer 26 is positioned for putting the key generator 15 into communication with the input of the second multiplexer 27, and also the signal Fu is inhibited, which stops the shift function of the key generator 15.

The signal RC assumes the value of logical 1 at the end of the transmission of the first key word and retains this value for the duration required for transmitting the second key word. When RC=0, the first register of the key generator is validated, while when RC=1, the second register is validated.

Practical realization of the circuits 45 presents no particular problems and it will not be necessary to provide further details on this subject.

The operation of the circuits shown in FIG. 6 is as follows. At the onset of transmission, the interface 11A sets the signal CD; the register 23A functions in the shift mode and furnishes the word clock signals fm0 ... fm9. The transmission interface also sets the signal FL, causing the signal AFL to be 1. The divider 44 for dividing the frequency by 2 furnishes the user word clock signal fu. The signal fu validates the input register 25 and triggers the function of the key generator 15. The output fn of the circuit 47 switches between 0 and 1 at each received word clock signal fmi. Thus the input register 25, the key generator circuit 15, the multiplexer 26, the multiplexer 27 and the input register 28 of the encoder 21 are synchronized by the various signals that are generated. Initially, since AFL has the value of logical 1, the two first code words generated by the encoder 21 will in fact be one-half flags identified as a function of the words present at the input. Then, the circuit 46 automatically positions the signal AFL to the value of 0, and the following data words will be encoded normally by the encoder 21. When the circuit 45 furnishes ft=1, indicating the end of the block of data to be transmitted, the key generator 15 is stopped. Similarly, via the multiplexer 27, the signal ft puts the output of the key generator 15 into communication with the input register 28 of the encoder 21. The signal ft remains at the value of logical 1 during the time required for transmitting two key words, under the control of the signal RC. Then, ft returns to zero, and the transmission interface 11A resets the signal FL, which will permit the emission of a new flag which will be the End Delimiter ED.

Figure 7:
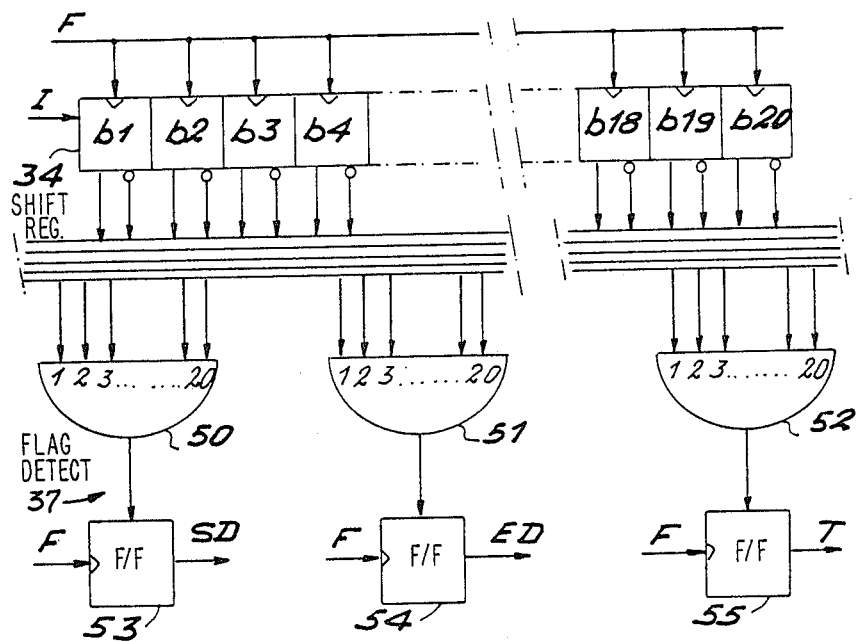
FIGS. 7, 8, 9, 10 and 11 show the elements in one embodiment of a transmission apparatus according to the invention.

FIG. 7, in greater detail, shows the shift register 34 and the flag detection device 37 which have already been mentioned in connection with FIG. 3. In the standard manner, the shift register 34 comprises a plurality of flip flops b1, b2, b20 disposed in staggered fashion, with the first stage b1 receiving the binary signals I coming from line 6. At its clock input, each of the flip flops receives the clock signal F emitted by the clock recovery circuit. Since the example relates to an 8B/10B code associated with flags including 20 bits, the shift register 34 should include at least 20 flip flops. In the standard manner, each of the flip flops has one direct output and one inverting output, the latter being represented in the drawing by a small circle.

The flag detector 37 substantially comprises AND gates 50–52 having as many inputs as a flag can have bits. Thus in the example shown, the AND gates will have 20 inputs.

To realize a detector of any kind, it is sufficient to use as many AND gates as there are flags required for the transmission method. The device in FIG. 7 relates to the case where only three flags SD, ED and T are used, and where the flags do not have any segment in common.

The connection between the shift register 34 and the detector is realized as follows: One of the two outputs of each flip flop, either the direct output or the inverting output, is connected to one input of each of the AND gates 50, 51, 52. Naturally the outputs of each of the flip flops will be chosen as a function of the flag that is to be decoded. Thus the contents of the 20 flip flops of the register 34 are permanently monitored by the AND gates 50, 51, 52, and when the register contains a set of bits corresponding to one of the flags, the output of the corresponding AND gate assumes the value of logical 1. Each of the outputs of the AND gates is connected to one of the flip flops (F/F) 53, 54, 55. The direct outputs of the first 10 flip flops of the register 34 are also connected to the input of the buffer device 39. These connections effect the linkage between the data of the message made up of the 10-bit words and the downstream portion of the decoding device.

Figure 8:
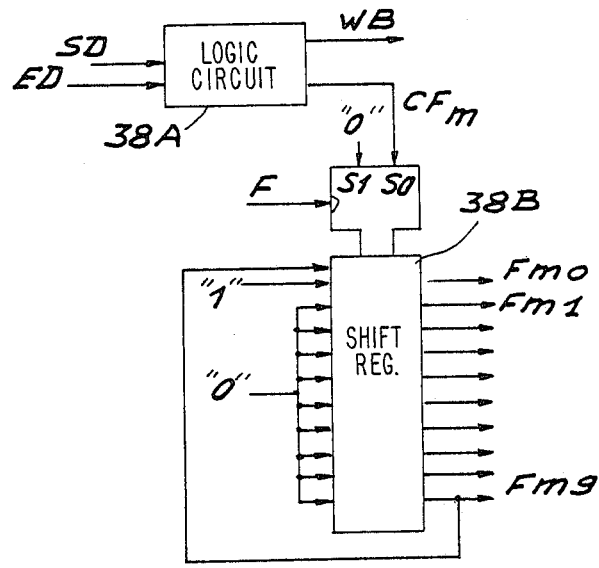

FIG. 8 shows a portion of the reception control device 38, which substantially serves to generate a word received clock signal. This circuit includes a shift register 38B, which at its clock input receives the recovered clock signal F. The shift register 38B has two control inputs S0, S1 which, as a function of the signals applied to them, determine the function of the shift register. When S1 equals 1, the register is in hold position, no matter what value is applied to its input S0. When S0 and S1 are at logical 0, the register functions in the shift mode, synchronized by the signal F. The shift register is controlled by the logical circuit 38A, the output CFm of which is connected to the input S0 of the shift register. The logical circuit 38A is connected such that the signal CFm, which generally has the value of logical 1, assumes the value of logical 0 during a clock period F when a Start Delimiter SD has been detected. The first parallel input of the shift register is permanently forced to the value of logical 1, while its other 9 inputs are forced to the value of logical 0. The tenth output Fm9 of the shift register is fed back to its serial input.

When a Start Delimiter SD is detected, the signal CFm briefly assumes the value of logical 0, and so the register 38B changes to the parallel loading mode, with the effect that the word received clock Fm is synchronized at the beginning of the frame. Then, as long as the signal SD has the value of logical 0, that is, as long as a new marker SD has not been detected, the control inputs S0 and S1 of the register 38B have the value of logical 1 and this reegister functions in the shift mode and at each of the ten outputs the signals designated as "word clock received", Fm0, Fm1, ..., Fm9 will appear, having a frequency one-tenth the frequency F, each of these signals being out of phase with respect to one of the others by a value equal to a multiple of the period of the recovered clock F. The manner in which the word received clock signals are used will be explained in the course of the ensuring description.

The circuit 38A also generates a signal WB, which assumes the value of logical 1 at a time Tm after the reception of a flag SD, and the value of logical 0 at the time Tm after the reception of a flag ED. The signal WB indicates the presence of words of the frame received at the input of the buffer 39, and controls access for writing at this buffer.

Figure 9:
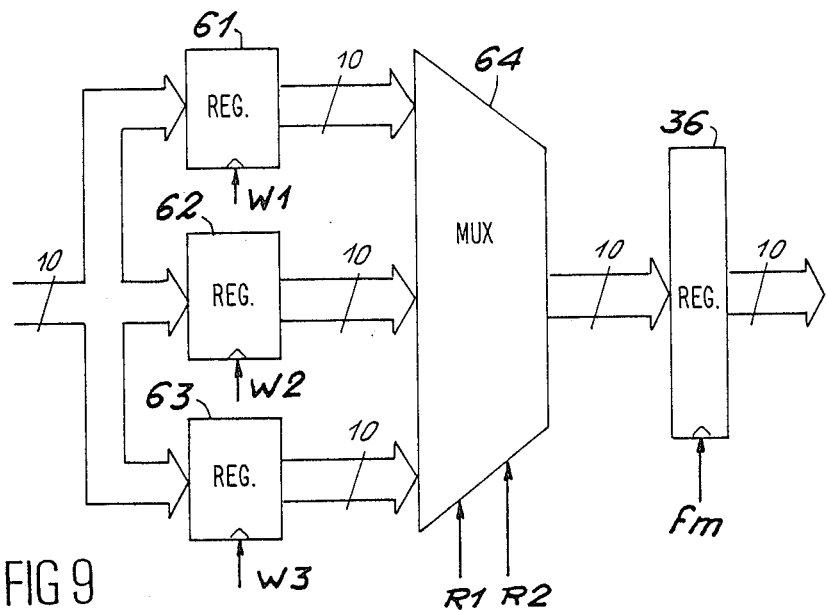

FIG. 9 shows an embodiment of the buffer device 39 shown in FIG. 3. This device includes 3 10-bit registers 61, 62, 63, each register including 10 input lines connected to ten first flip flops of the shift register 34. Writing in the registers 61, 62, 63 is controlled by clock signals W1, W2, W3, respectively. Each of the registers include 10 output lines, which are connected to the input of a multiplexer 64 having 10 output lines. The multiplexer 64 is controlled by two selection signals R1, R2. The output of the multiplexer 64 is connected to the input of the register 36. When R1=1 and R2=0, the output of the register 61 is made to communicate with the register 36; when R1=0 and R2=0, the output of the register 61 is made to commuciate with the register 36; when R1=0 and R2=1, the register 62 is made to communicate with the register 36; and when R1 and R2 both equal 0, the register 63 is made to communicate with the register 36.

Figures 10, 11:
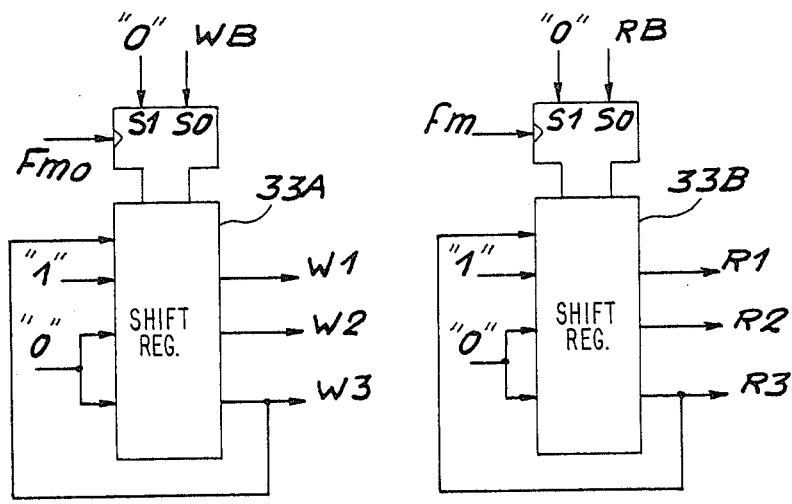
Figure 12:
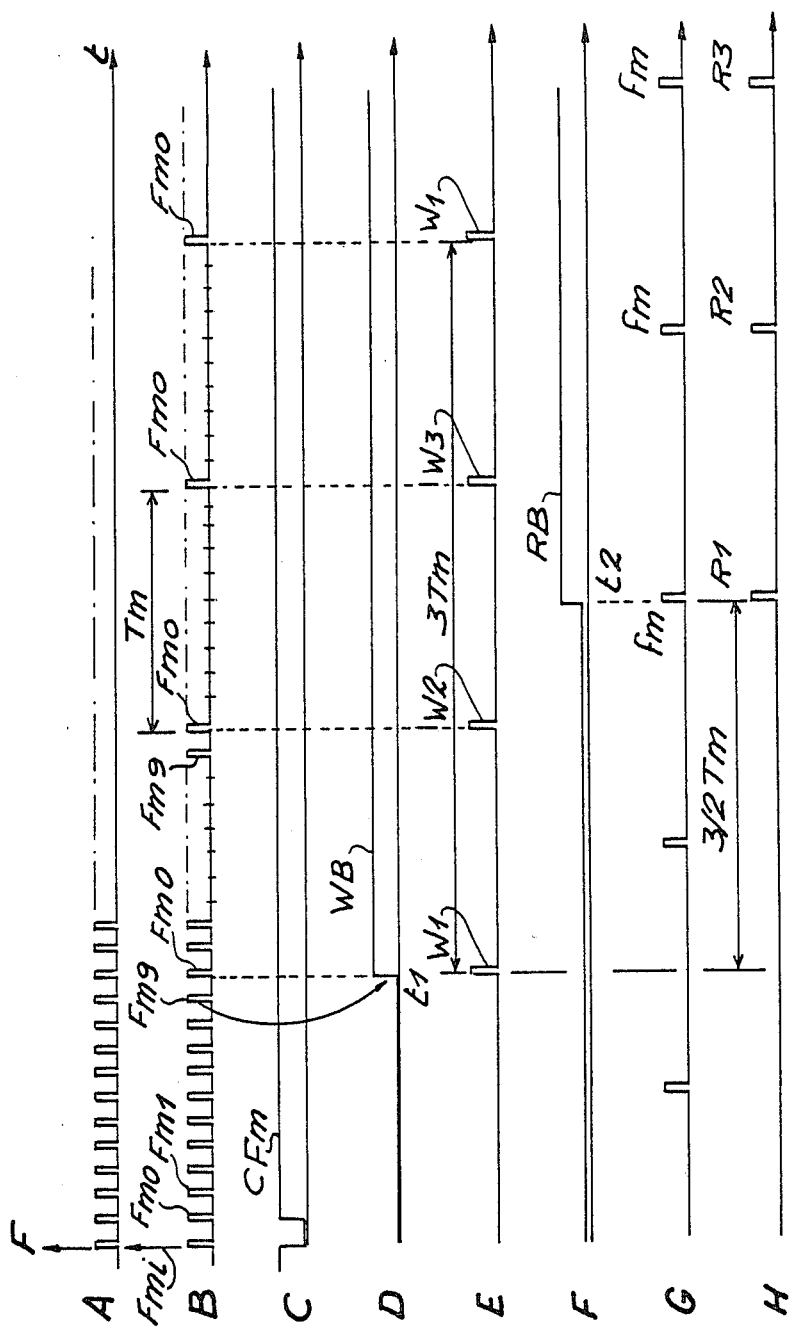
FIG. 12 provides time diagrams with which the function of the apparatus according to the invention can be explained.

The signals W1, W2, W3 are generated by the circuit shown in FIG. 10. The signals R1, R2 are generated by the circuit shown in FIG. 11. FIG. 12 shows time diagrams with which the function of the buffer device and the circuits shown in FIGS. 10 and 11 can be explained. To describe the function of the buffer device 39, a station R is taken as an example, at the moment it receives a message from a station E. At its input, the buffer device 39 of R receives 10-bit words of encoded information, at a clock rate defined by the word received clock Fm extracted from the signal coming from the channel. The role of the buffer device is to transfer these words to its output, where they are read at a clock rate defined by the local word clock fm of the station R. Fm is determined by the local clock of transmitting station E; the local clocks have the same nominal frequency, and the distance in frequency between Fm and fm is very slight but not zero, and the phase relationship between these two signals is arbitrary and variable. The buffer device 39 must be such that, taking into account the tolerance in frequency of the lcoal clocks f, and the maximum length of the frames, the station R will receive at its register 36 all the words of the frame transmitted by E, and will receive each of them only once; also, if it approaches a situation where this rule will no longer be obeyed, the buffer device 39 must issue an alarm signal (UF or OF). This dictates that the frames emitted by the station E be separated by filler characters, or fillers, and that these characters not pass through the buffer device. During the reception of the fillers, the buffer device assumes a state of stand by, in the nominal situation. It functions during the time intervals when the signal WB has the value of logical 1.

The depth P of the buffer is the number of its registers, three in this case; its effect is to multiply by P the time interval during which the words received can be used in the circuits clocked by the local clock fm.

The circuit shown in FIG. 10 is part of the control circuit 33 of the buffer device 39. This circuit substantially comprises a shift register 33A, which at its clock input receives a word received clock signal Fm0, and at its control input S0 receives a signal WB which controls the register for shift function when it assumes the value of logical 1. The control input S1 of the register 33A is forced to the value of logical 0. When S0 is also at the value of logical 0, the register is in the parallel loading position. The shift register 33A includes three stages and has three parallel input lines. The first input line is permanently forced to the value of logical 1, and the other two parallel inputs are forced to the value of logical 0. The register has three output lines W1, W2, W3, which are connected respectively to the clock inputs of the registers 61, 62, 63 of the buffer device. The output W3 of the register is fed back to its serial input.

The timing diagrams A, B, C, D and E shown in FIG. 12 are intended to render the funtion more comprehensible.

The timing diagram A shows the recovered clock F.

The timing diagram B shows the word received clock signals Fm0, Fm1, ..., Fm9 delivered by the register 38B of FIG. 8.

The timing diagram C shows the signal CFm applied to the register 38B of FIG. 8.

The timing diagram D shows the signal WB of the output of the circuit 38A.

The timing diagram E shows the writing control signals W1, W2, W3 of the registers 61, 62, 63 of the buffer 33.

When a message is received, the clock recovery circuit 16 of FIG. 1 delivers the recovered clock signal F shown in the timing diagram A. As soon as the flag detection device 37 delivers the signal SD indicating the presence of a Start Delimiter SD, the output signal CFm of the circuit 38A of FIG. 8 delivers a pulse at logical 0, which synchronizes the word received clock Fm. After the first 10 bits following the Start Delimiter have been received, that is, at the end of a word period Tm that is equal to 10 periods of the clock F, the signal WB emitted by the circuit 38A of FIG. 1 assumes the value of logical 1, as shown at time t1 on the timing diagram D. The signal WB thus triggers the shift of the register 33A of FIG. 2, and the signals W1, W2, W3 shown in timing diagram E appear at the output of the register 33A. The three signals W1, W2, W3 have a frequency equal to one-third the word frequency Fm0; the signal W1 is fixed at Fm0, W2 lags with respect to W1 by one word period Tm, and the signal W3 lags by two word periods Tm with respect to the signal W1. Thus the time interval during which the data are acessible in one of the registers 61, 62, 63 shown in FIG. 9 is equal to three items the word clock period Tm.

FIG. 11 shows the circuit that enables the generation of the control signals R1 and R2 of the multiplexer 64 of FIG. 9. This circuit is also part of the control circuit 33 of the buffer device. This circuit includes a shift register 33B, which is identical to the register 33A of FIG. 10. The parallel inputs receive the same preloading values. The third output R3 is fed back to the serial input of the register. The input S1 is forced to 0 when the input S0 receives a signal RB. The clock input of the register 33B receives a local word clock signal fm. The signal RB controls the generation of the clock signals R1, R2, R3 in the same manner as the signal WB in FIG. 10 controls the signals W1, W2, W3. The signal RB, which is synchronous with the local word clock fm, is derived from the signal WB, which is synchronous with the word received from clock Fm, in a unifier device which enables the transfer of synchronism and introduces a time lag or delay, having a mean value of 1.5 Tm, between the setting of WB and the setting of RB. This delay is such that the output of one register (61, 62 or 63) is read nominally at the middle of the period of 3 Tm, during which it retains the same information. The signal RB returns to logical 0 whenever, after an End Delimiter ED has been received, the signal WB has returned to logical 0 and the clock W1-3 has been stopped in a certain phase, the clock R1-3 reaches the same phase. The signal RB indicates the presence of words of the frame received at the output of the buffer 39.

The logical alarm UF/OF is based on a succession of coincidences between the phases of the clocks W1-3 and R1-3. The timing diagram F of FIG. 12 shows the signal RB, and the timing diagram G shows the local word clock signal fm. As before, the signals R1, R2 and R3 shown in the timing diagram H have a frequency of one-third the local word clock frequency fm. The signal R1 is fixed at the signal fm; it appears for the first time when RB is set at time T2.

The signal R2 lags by one local word clock period, and the signal R3 lags by two periods of the local word clock with respect to the signal R1.

It is apparent from the above description that the registers 61, 62, 63 of the buffer device 39 are controlled for writing by the signals W1, W2, W3, which are synchronized by the word received clock Fm, while these same registers are ready the control signals of the multiplexer 64, which are derived from the local word clock signal fm. Thus, even if the phase of the local clock drifts with respect to that of the recovered clock, the words received can still all be transferred to the decoding device. Nevertheless, the frame should be short enough and the drift of the local clock signal should be slight enough for the phase displacement between the local clock and the recovered clock, at the end of the message, to be less than ±0.5 Tm. However, if that should not be the case, then a buffer device should be provided which includes more than three registers and a multiplexer having a corresponding number of inputs. Similarly, the circuits of FIGS. 10 and 11 should be modified and should use shift registers 33A, 33B including as many stages as there are registers in the buffer device. The above explanation given for the case of a buffer having three registers can readily be generalized to apply to any number P of registers. Accordingly, no further description need be provided for the more general embodiment.

Downstream of the buffer device 39, the transfer of the data received can be controlled by signals synchronized solely by the local clock fm. This accordingly applies to the input register 36 of the decoder 10, its output register 32 and the toggle 32A, the demultiplexer 37, the register 35 and the error detector 17.

It goes without saying that according to the invention the above-described embodiment can be adapted to an arbitrary MB/NB code in which the flags comprise an arbitrary multiple of N bits. However, the foregoing description shows that the realization of encoding and decoding devices is simplified, if data words and code words having the minimum of bits are used. In particular, the coding and decoding devices are larger in size, the more bits the data words and code words contain. In view of the technology that is presently available, it should be noted that the choice of an 8B/10B code is the one with which the best cost-benefit ratio can be obtained when the invention is put into pratice.

What is claimed is:

1. A method for transmission of digital data in which each data word includes a number M of bits comprising encoding each data word with an associated code word of N bits, N being greater than M, transmitting each code word serially, and forming a frame of a message by accompanying a succession of transmitted code words with at least one flag, each of said code words
   being selected so that the code word contains no more than four consecutive logical ones or four consecutive logical zeroes,
   the code word neither begins nor ends with more than two consecutive logical ones or more than two consecutive logical zeroes,
   and so that the code word has a charge such that the algebraic difference between the number of logical ones and the number of logical zeroes equals no more than 1 as an absolute value, and no more than 2 as an absolute value, if N is even;
   and wherein the flag is formed to have a number of bits equal to N or a multiple of N and
   such that the flag contains no more than four consecutive logical ones or four consecutive logical zeroes,
   neither begins nor ends with more than two consecutive logical zeroes, and
   the Hamming distance between the flag and any encoded sequence of bits of the same length is at least equal to 2.

2. A transmission method as defined by claim 1, wherein N is even.

3. A transmission method as defined by claim 2, wherein the flag has a zero charge, so that it contains as many logical ones as zeroes.

4. A transmission method as defined by claim 2, wherein there are at least two flags, and the Hamming distance between the two flags is at least equal to 2.

5. A transmission method as defined by claim 2, wherein said encoding comprises associating certain data words with a single code word having a zero charge, and associating other data words with two code words having opposite charges which are not zero, and wherein, upon a data word being associated with two code words of opposite charges, such data word is encoded by the one of the two code words that has a charge which is opposite the charge of a preceding code word having a non-zero charge in the message.

6. A transmission method as defined by claim 5, wherein the two code words associated with the same data word are complimentary.

7. A transmission method as defined by claim 2, wherein said transmitting comprises transmitting the code words and the flags serially over a transmission channel after an encoding of the NRZ type.

8. A transmission method as defined by claim 2, wherein the data words comprise M=8 bits, the code words comprise N=10 bits, and the flags comprises 20 bits.

9. A transmission method as defined by claim 2, further comprising the data words from user words, directly if these user words are of the same length as the data words, or by multiplexing user words if the user words have a length that is a multiple of the length of the data words, the data words being demultiplexed so as to reconstitute the user words.

10. A transmission method as defined by claim 2, wherein each frame includes a predetermined number of user words to which key words are added based on said user words of the message via Reed-Solomon encoding, and wherein the user words and the key words of a frame are processed by a Reed-Solomon error detection and correction method.

11. A digital data transmission apparatus comprising an encoding device (1) for receiving data words of M bits in parallel and for encoding the data words as associated code words of N bits in parallel, N being greater than M, and for furnishing flag; a parallel/serial conversion device (2) for converting the code words and flag to serial form; a control device (3, 23) for furnishing control signals and synchronization signals to said encoding device and to said conversion device; and means for serially transmitting successions of flags and code words to form frames, said encoding device including means (21) for generating, as a function of each data word and of said control signals, said code words and said flag
- such that each code word and flag contains no more than four consecutive logical ones or four consecutive logical zeroes,
- and neither begins nor ends with more than two consecutive logical ones or two consecutive logical zeroes;
- and wherein each code word has a charge at most equal to 1 as an absolute value, if N is odd, or 2 as an absolute value, if N is even, and the Hamming distance between a flag and any sequence of consecutive bits of the same length as the flag is at least equal to 2, said encoding device furnishing the flag to have either N bits or a multiple of N bits.

12. A transmission apparatus as defined by claim 11, wherein the encoding device includes means (21) for generating flags having a zero charge.

13. A transmission apparatus as defined by claim 11, wherein the encoding device includes means (21) for generating flags such that the Hamming distance between two flags is at least equal to 2.

14. A transmission apparatus as defined by claim 11, wherein the encoding device (1) includes means for generating, as a function of a logical value of a selection signal (AC), one code word from among two possible code words having opposite non-zero charges associated with the same data word, wherein said encoding device includes means for providing a charge indicator (DC) of the charge of a code word having a non-zero charge, and a selection device (29) for furnishing said selection signal as a function of the logical value of said charge indicator (DC), such as to select the one of the two code words that has a charge opposite the charge of a preceding code word having a non-zero charge in the message.

15. A transmission apparatus as defined by claim 14, wherein said charge indicator (DC) assumes a value of logical 0 when the code word has a zero charge and assumes a value of logical 1 otherwise, and wherein the selection device includes a toggle (29 B) having an input connected to the output of an exclusive OR gate (29 A) having first and second inputs, the first input receiving said charge indicator and the second input being connected to the output of said toggle (29 B), said output furnishing said selection signal (AC).

16. A transmission apparatus as defined by claim 15, wherein the generating means comprises a memory (21) receiving the data words on N address lines and a flag control signal (AFL) on an additional address line, said memory (21) having means for furnishing, as a function of the address applied to it, words of N bits comprising code words, flags and fractions of flags.

17. A transmission apparatus as defined by claim 16, wherein the memory (21) includes an additional address line connected to the output of the toggle (29 B) of the selection device (29).

18. A transmission apparatus as defined by claim 11, wherein the encoding device (1) receives data words of M=8 bits and furnishes code words of N=10 bits.

19. A transmission apparatus as defined by claim 11, wherein the encoding device (1) receives data words from the output of a multiplexer (26, 27), said multiplexer including M output lines and a multiple of M input lines.

20. A transmission apparatus as defined by claim 19, further comprising a Reed-Solomon key generator (15) for receiving user words of an integral multiple of M bits and for furnishing at an output thereof key words of the the integral multiple of bits, said output being connected to the input of said multiplexer.

* * * * *

UNITED STATES PATENT AND TRADEMARK OFFICE
CERTIFICATE OF CORRECTION

PATENT NO. : 4,811,361

DATED : March 7, 1989

INVENTOR(S) : Bacou et al

It is certified that error appears in the above-identified patent and that said Letters Patent is hereby corrected as shown below:

Col. 28, Claim 1, line 28, after "1 as an absolute value" insert --if N is odd--.

Col. 28, Claim 1, line 36, after "logical" insert --ones or two consecutive logical--.

Col. 28, Claim 6, line 59, delete "same".

Col. 28, Claim 8, line 67, "comprises" should be --comprise--.

Col. 29, Claim 9, line 2, after "comprising" insert --obtaining--.

Col. 30, Claim 16, line 3, delete "N" and substitute --M--.

Signed and Sealed this

Twenty-fourth Day of October, 1989

*Attest:*

DONALD J. QUIGG

*Attesting Officer*   *Commissioner of Patents and Trademarks*